United States Patent
Abiko et al.

(10) Patent No.: US 8,599,613 B2
(45) Date of Patent: Dec. 3, 2013

(54) NONVOLATILE SEMICONDUCTOR MEMORY

(75) Inventors: Naofumi Abiko, Kawasaki (JP); Masahiro Yoshihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 13/428,914

(22) Filed: Mar. 23, 2012

(65) Prior Publication Data
US 2012/0250411 A1    Oct. 4, 2012

(30) Foreign Application Priority Data
Mar. 29, 2011    (JP) .................. 2011-073246

(51) Int. Cl.
*G11C 16/00*    (2006.01)
(52) U.S. Cl.
USPC .................. 365/185.09; 365/185.22; 365/200
(58) Field of Classification Search
USPC ....................................... 365/220
See application file for complete search history.

(56) References Cited

U.S. PATENT DOCUMENTS

| 7,304,893 | B1* | 12/2007 | Hemink et al. .......... 365/185.22 |
| 7,590,006 | B2 | 9/2009 | Tokiwa |
| 2010/0195411 | A1 | 8/2010 | Abiko |
| 2011/0205806 | A1 | 8/2011 | Yoshihara et al. |

FOREIGN PATENT DOCUMENTS

| JP | 2008-4178 | 1/2008 |
| JP | 2010-176761 | 8/2010 |

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

According to one embodiment, a nonvolatile semiconductor memory includes a memory cell array including memory cells of a first unit in which read and write are parallelly performed, n (n is a natural number of not less than 2) sense amplifiers, n detection circuits corresponding to the n sense amplifiers, an accumulator configured to divide the first unit data read from the memory cell array into z (z is a natural number) second unit data and accumulate a fail bit for which the write is incomplete for the second unit data, and a control circuit configured to control an operation of detecting the fail bit after the write.

20 Claims, 25 Drawing Sheets

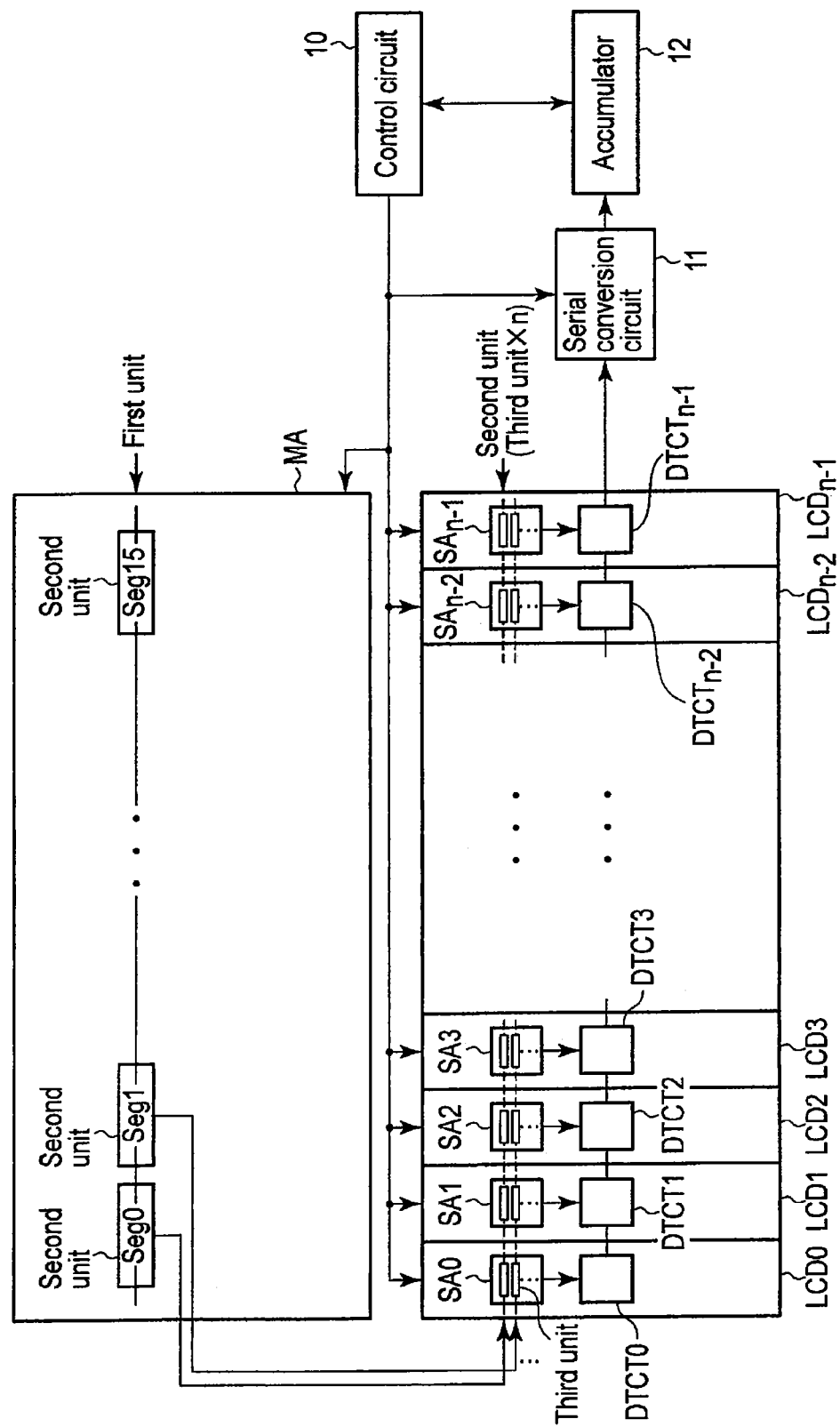
F I G. 1

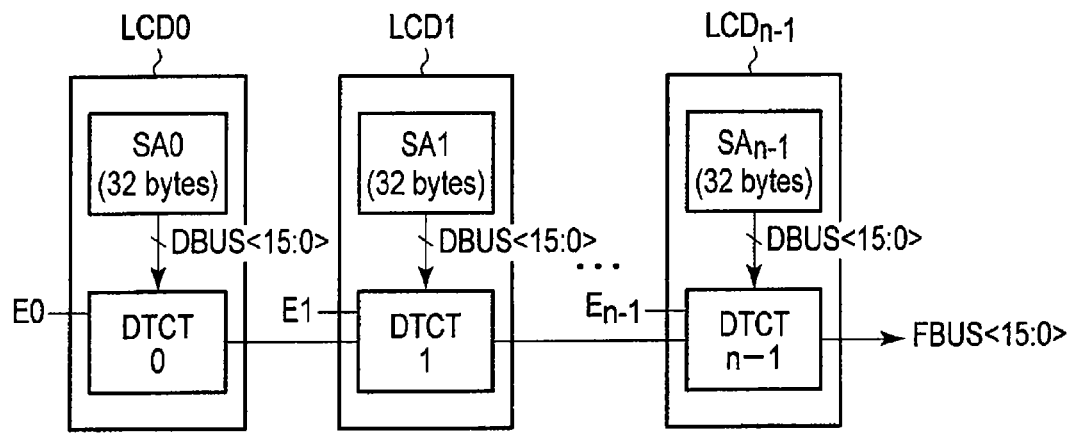
F I G. 3
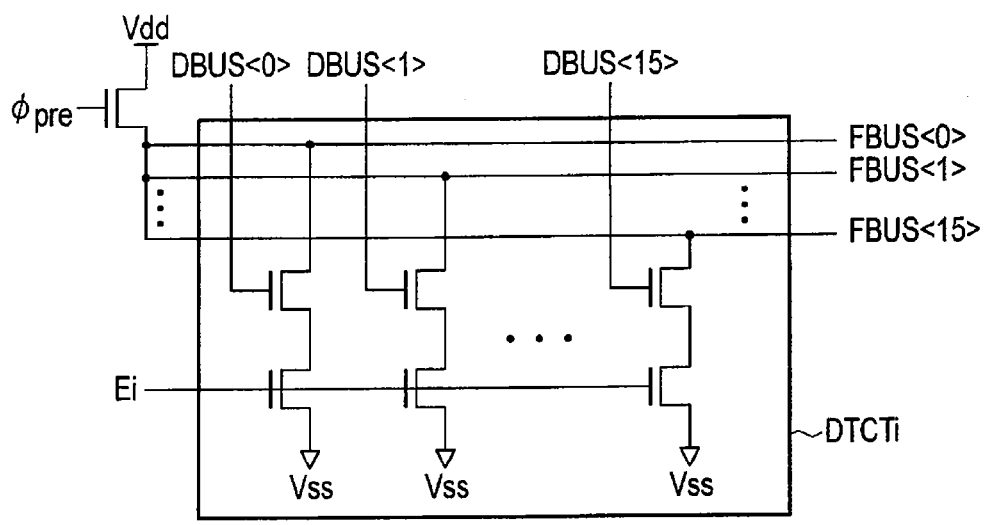
F I G. 4
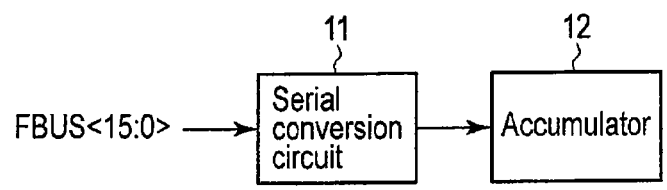
F I G. 5

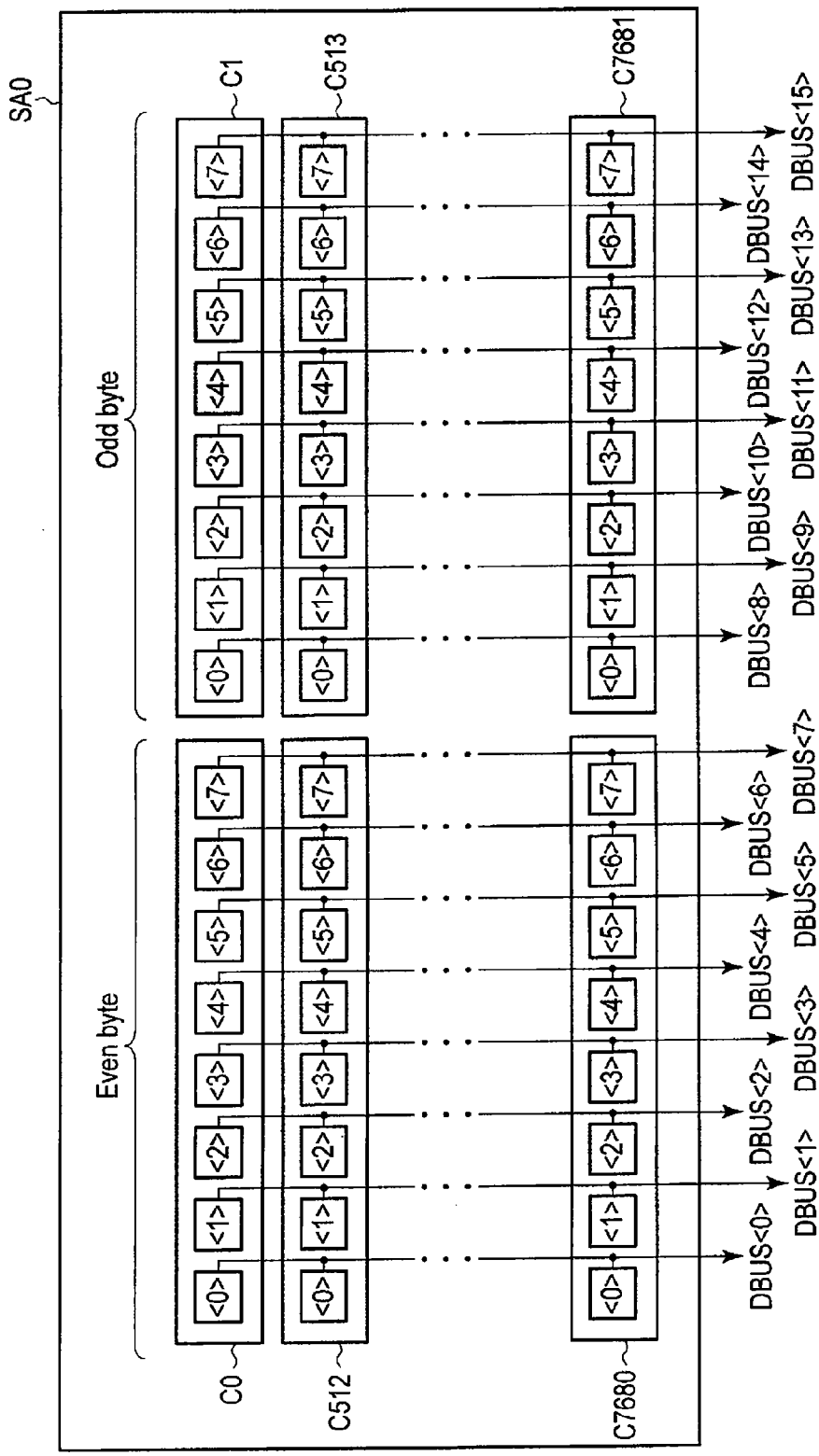
F I G. 6

| Segment | Seg0 (Tier0) | | | Seg1 (Tier1) | | | | Seg15 (Tier15) | | |
|---|---|---|---|---|---|---|---|---|---|---|
| Number of detection | 1 | 2 | ... | 256 | 1 | 2 | ... | 256 | 1 | 2 | ... | 256 |
| FBUS<7:0> (Even byte) | C0<7:0> | C2<7:0> | ... | C510<7:0> | C512<7:0> | C514<7:0> | ... | C1022<7:0> | C7680<7:0> | C7682<7:0> | ... | C8190<7:0> |
| FBUS<15:8> (Odd byte) | C1<7:0> | C3<7:0> | ... | C511<7:0> | C513<7:0> | C515<7:0> | ... | C1023<7:0> | C7681<7:0> | C7683<7:0> | ... | C8191<7:0> |

F I G. 7

| Sense amplifier | | Sense amplifier SA0 (Tier0~15) | | | | Sense amplifier SA1 (Tier0~15) | | | | Sense amplifier SA$_{n-1}$ (Tier0~15) | | |
|---|---|---|---|---|---|---|---|---|---|---|---|---|
| Number of detection | | Tier0<br>1 | Tier1<br>2 | ... | Tier15<br>16 | Tier0<br>1 | Tier1<br>2 | ... | Tier15<br>16 | Tier0<br>1 | Tier1<br>2 | ... | Tier15<br>16 |
| FBUS<7:0><br>(Even byte) | | C0<br><7:0> | C512<br><7:0> | ... | C7680<br><7:0> | C2<br><7:0> | C514<br><7:0> | ... | C7682<br><7:0> | C510<br><7:0> | C1022<br><7:0> | ... | C8190<br><7:0> |
| FBUS<15:8><br>(Odd byte) | | C1<br><7:0> | C513<br><7:0> | ... | C7681<br><7:0> | C3<br><7:0> | C515<br><7:0> | ... | C7683<br><7:0> | C511<br><7:0> | C1023<br><7:0> | ... | C8191<br><7:0> |

F I G. 10

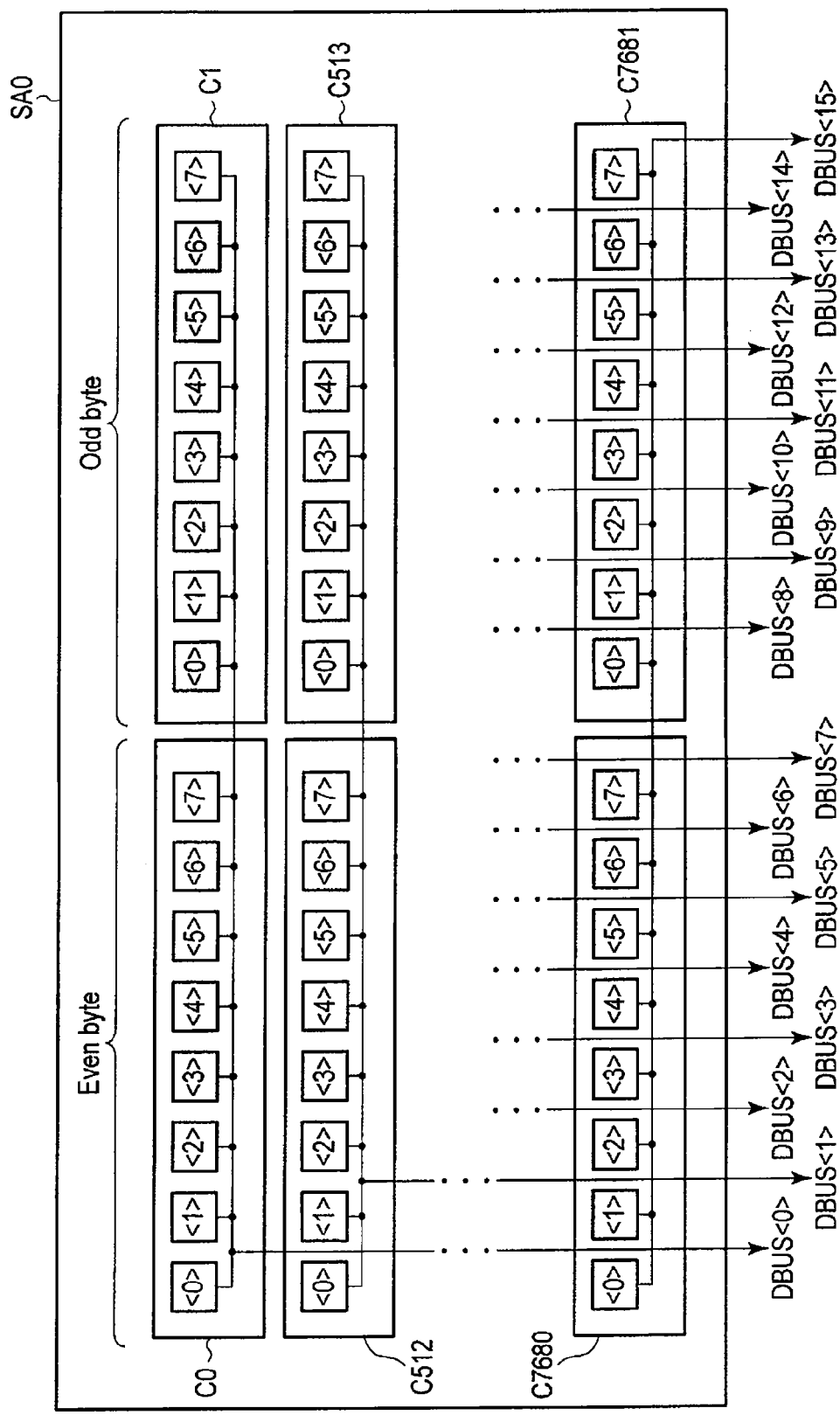
F I G. 11

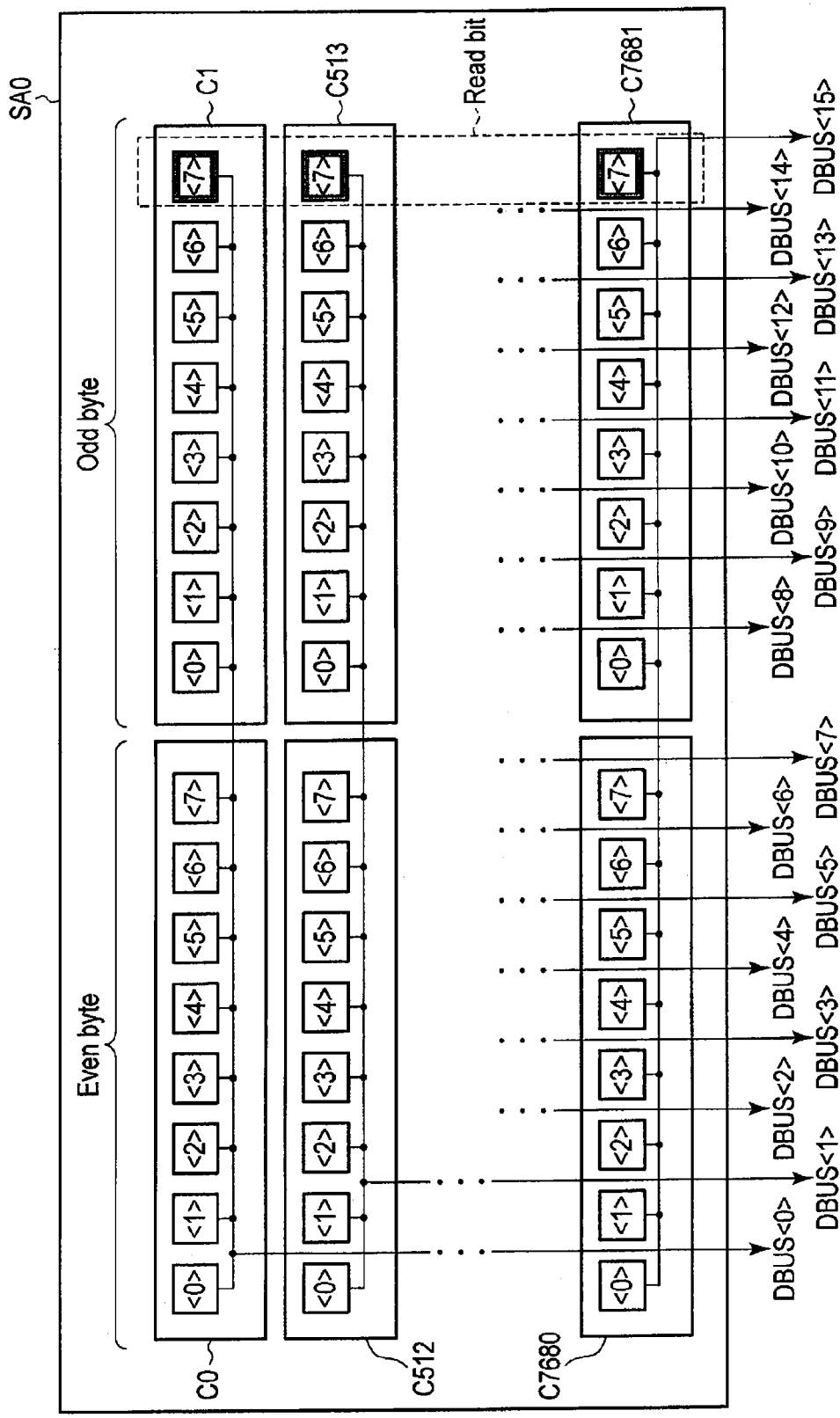
F I G. 14

| Sense amplifier | | Sense amplifier SA0 (Tier0~15) | | | | Sense amplifier SA1 (Tier0~15) | | | | Sense amplifier SAn-1 (Tier0~15) | | | |
|---|---|---|---|---|---|---|---|---|---|---|---|---|---|
| Number of detection | | Tier 0~15 1 | Tier 0~15 2 | ... | Tier 0~15 16 | Tier 0~15 1 | Tier 0~15 2 | ... | Tier 0~15 16 | Tier 0~15 1 | Tier 0~15 2 | ... | Tier 0~15 16 |
| FBUS<7:0> (Even byte) | | C0<0> C512<0> | C0<1> C512<1> | ... | C1<7> C513<7> | C2<0> C514<0> | C2<1> C514<1> | ... | C3<7> C515<7> | C510<0> C1022<0> | C510<1> C1022<1> | ... | C511<7> C1023<7> |
| | | C3584<0> | C3584<1> | ... | C3585<7> | C3586<0> | C3586<1> | ... | C3587<7> | C4094<0> | C4094<1> | ... | C4095<7> |
| FBUS<15:8> (Odd byte) | | C4096<0> C4608<0> | C4096<1> C4608<1> | ... | C4097<7> C4609<7> | C4098<0> C4610<0> | C4098<1> C4610<1> | ... | C4099<7> C4611<7> | C4606<0> C5118<0> | C4606<1> C5118<1> | ... | C4607<7> C5119<7> |
| | | C7680<0> | C7680<1> | ... | C7681<7> | C7682<0> | C7682<1> | ... | C7683<7> | C8190<0> | C8190<1> | ... | C8191<7> |

F I G. 15

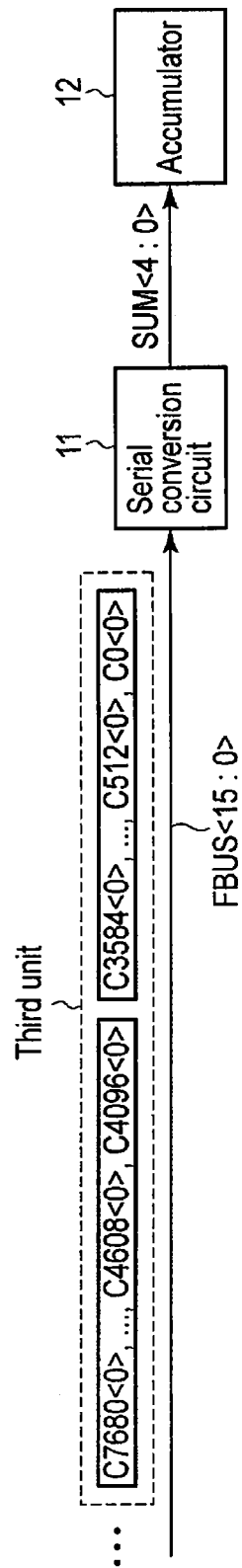
F I G. 16

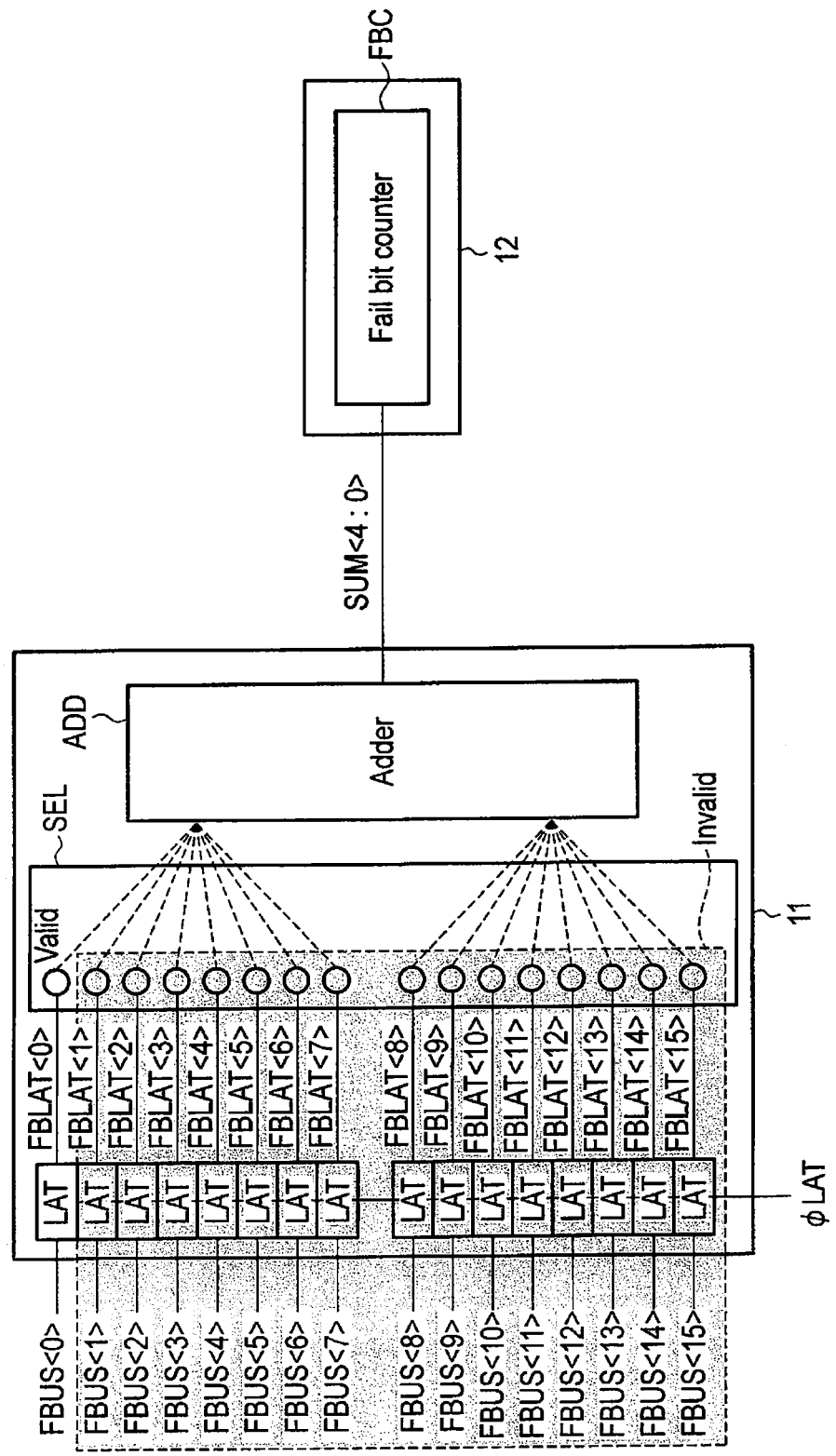
F I G. 17

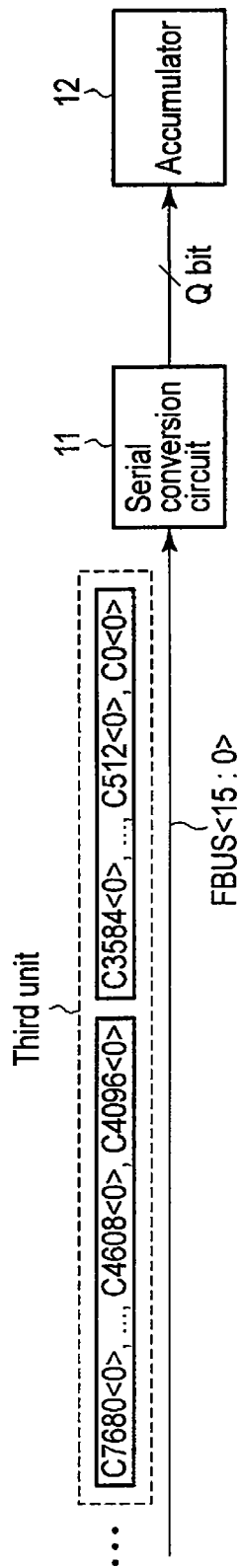
F I G. 19

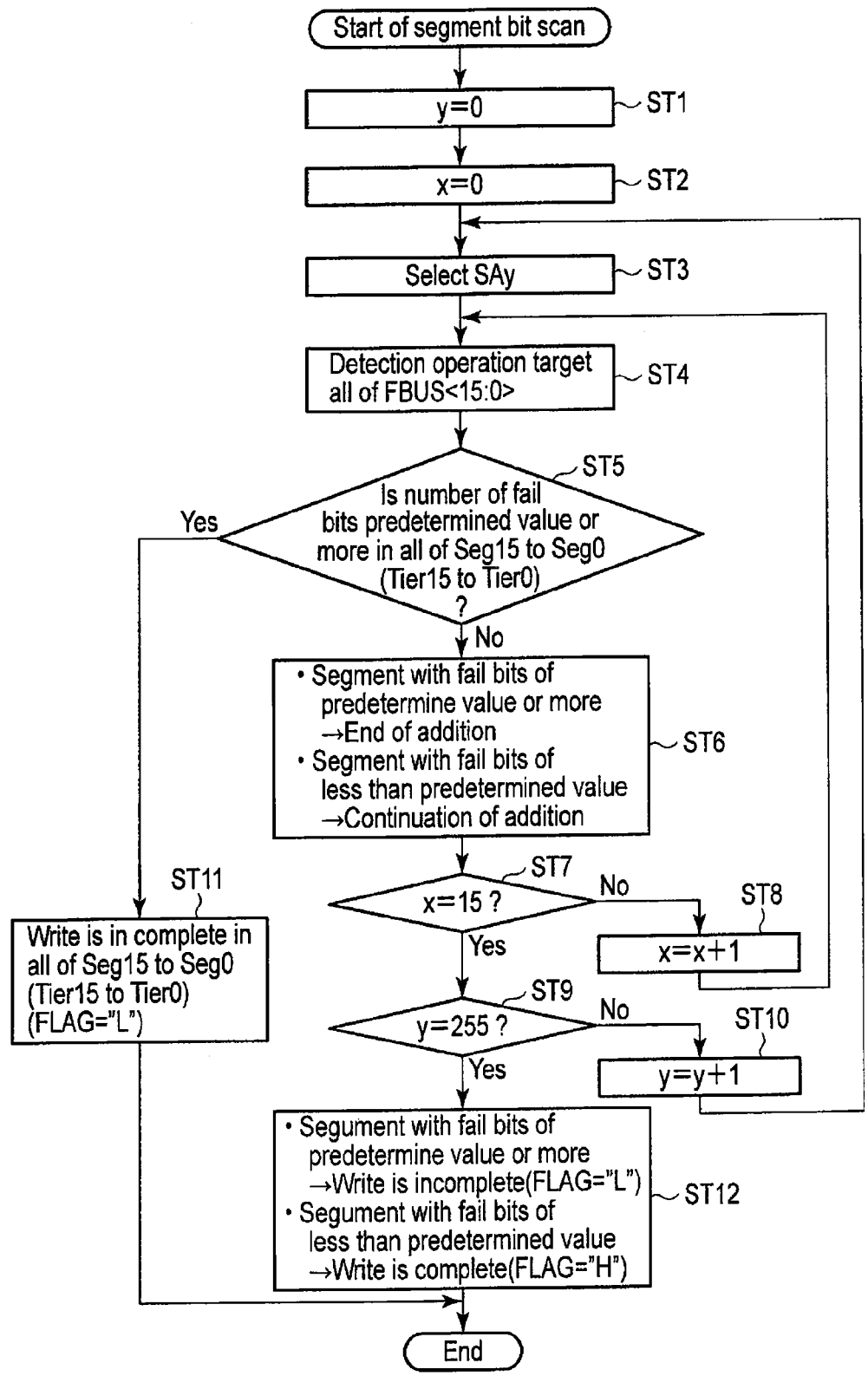
F I G. 22

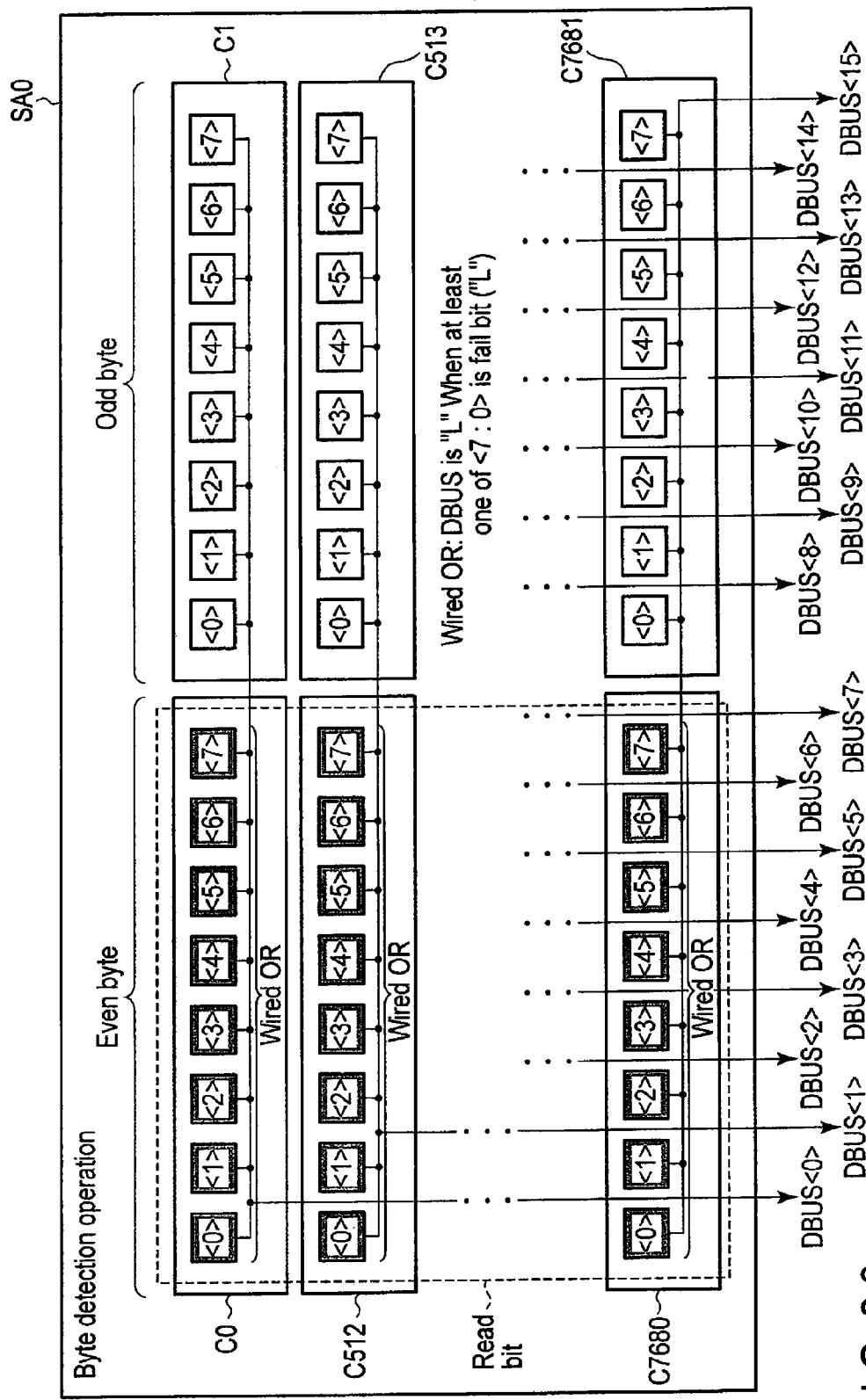
F I G. 23

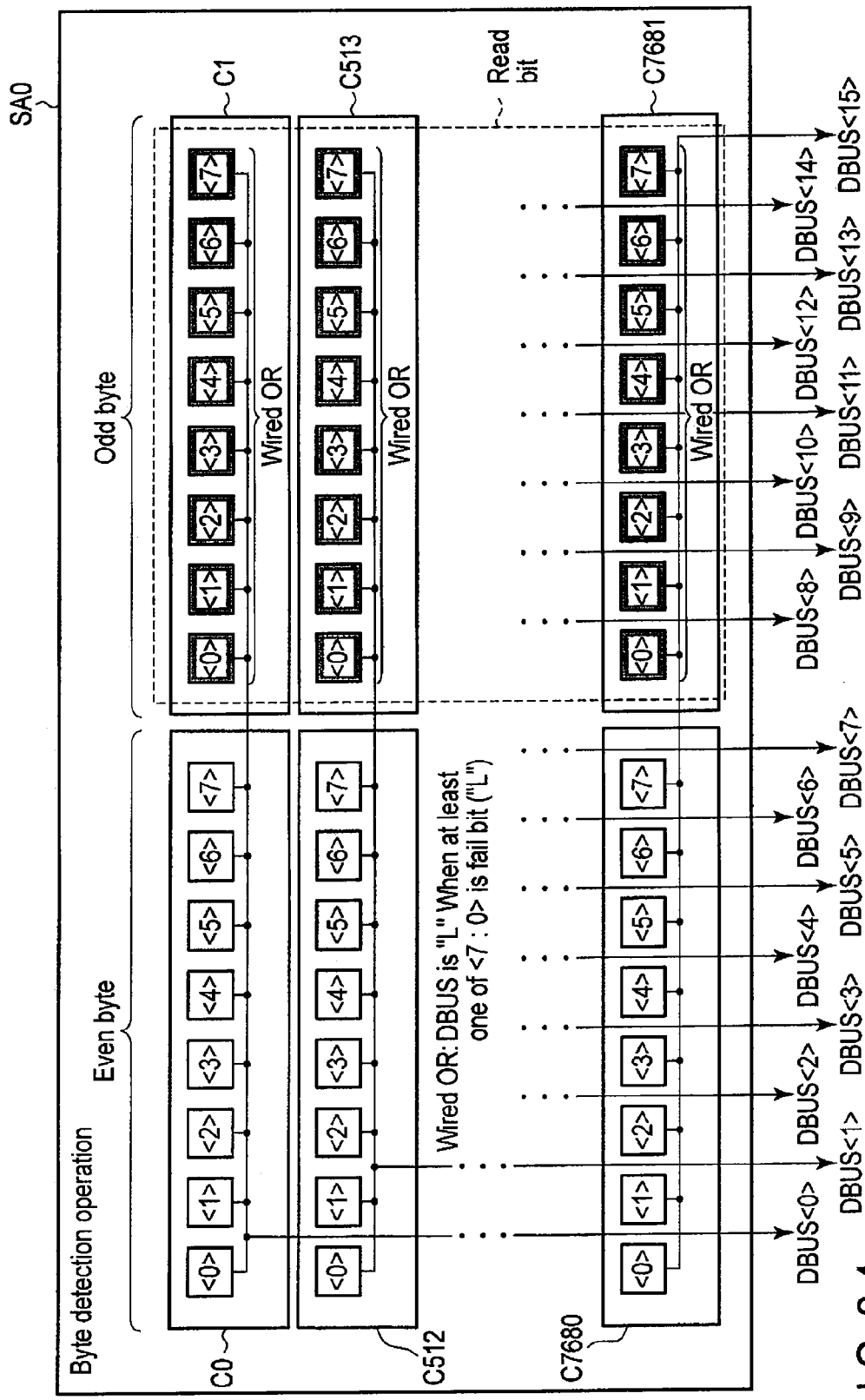
F I G. 24

| Sense amplifier | SA0 | SA1 | ... | SAn-1 | ... | SA0 | SA1 | ... | SAn-1 | ... | SA0 | SA1 | ... | SAn-1 |
|---|---|---|---|---|---|---|---|---|---|---|---|---|---|---|
| Number of detection | Tier 0~15<br>1 | Tier 0~15<br>2 | ... | Tier 0~15 | ... | Tier 0~15<br>1 | Tier 0~15<br>2 | ... | Tier 0~15 | ... | Tier 0~15<br>1 | Tier 0~15<br>2 | ... | Tier 0~15 |
| FBUS<7:0><br>(Even byte) | C0<0> C512<0> ... C3584<0> | C2<0> C514<0> ... C3586<0> | ... | C510<0> C1022<0> ... C4094<0> | ... | C0<1> C512<1> ... C3584<1> | C2<1> C514<1> ... C3586<1> | ... | C510<1> C1022<1> ... C4094<1> | ... | C1<7> C513<7> ... C3585<7> | C3<7> C515<7> ... C3587<7> | ... | C511<7> C1023<7> ... C4095<7> |
| FBUS<15:8><br>(Odd byte) | C4096<0> C4608<0> ... C7680<0> | C4098<0> C4610<0> ... C7682<0> | ... | C4606<0> C5118<0> ... C8190<0> | ... | C4096<1> C4608<1> ... C7680<1> | C4098<1> C4610<1> ... C7682<1> | ... | C4606<1> C5118<1> ... C8190<1> | ... | C4097<7> C4609<7> ... C7681<7> | C4099<7> C4611<7> ... C7683<7> | ... | C4607<7> C5119<7> ... C8191<7> |

F I G. 2 5

NONVOLATILE SEMICONDUCTOR MEMORY

CROSS-REFERENCE TO RELATED APPLICATIONS

This application is based upon and claims the benefit of priority from prior Japanese Patent Application No. 2011-073246, filed Mar. 29, 2011, the entire contents of which are incorporated herein by reference.

FIELD

Embodiments described herein relate generally to a nonvolatile semiconductor memory.

BACKGROUND

In the write operation of a nonvolatile semiconductor memory, write and verify for detecting after the write whether the number of fail bits is smaller than a predetermined value are repetitively performed. However, when the number of fail bits increases due to a smaller memory cell size, the number of repetitions also increases, resulting in difficulty in increasing the speed of write operation.

In addition, when the number of bits to be written in one memory cell increases along with an increase in the number of signal levels to be written in a memory cell, the threshold distribution of each bit needs to fall within a narrow range. To do this, control needs to be done to gradually shift the memory cell threshold. This also leads to an increase in the number of repetitions of write and verify.

Quickly detecting the number of fail bits when the number of repetitions of write and verify increases is an important factor for increasing the speed of write operation.

BRIEF DESCRIPTION OF THE DRAWINGS

FIG. 1 is a block diagram showing the basic arrangement of a nonvolatile semiconductor memory;
FIG. 3 is a block diagram showing local column decoders;
FIG. 4 is a circuit diagram showing a detection circuit;
FIG. 5 is a block diagram showing a serial conversion circuit and an accumulator;
FIG. 6 is a block diagram showing an example of the arrangement of a sense amplifier;
FIG. 7 is a view showing a method of reading data from the sense amplifiers;
FIG. 10 is a view showing a method of reading data from the sense amplifier;
FIG. 11 is a block diagram showing another example of the arrangement of the sense amplifier;
FIGS. 12, 13, and 14 are block diagrams showing a fail bit detection operation;
FIG. 15 is a view showing a method of reading data from the sense amplifier;
FIG. 16 is a block diagram showing another example of data transfer;
FIG. 17 is a block diagram showing another example of the arrangement of the serial conversion circuit;
FIG. 19 is a block diagram showing still another example of data transfer;
FIG. 22 is a flowchart illustrating a fail bit scan method;
FIGS. 23 and 24 are block diagrams showing a fail byte detection operation;
FIG. 25 is a view showing a method of reading data from the sense amplifier.

DETAILED DESCRIPTION

In general, according to one embodiment, a nonvolatile semiconductor memory comprising: a memory cell array including memory cells of a first unit in which read and write are parallelly performed; n (n is a natural number of not less than 2) sense amplifiers; n detection circuits corresponding to the n sense amplifiers; an accumulator configured to divide the first unit data read from the memory cell array into z (z is a natural number) second unit data and accumulate a fail bit for which the write is incomplete for the second unit data; and a control circuit configured to control an operation of detecting the fail bit after the write, wherein the control circuit stores third unit data of each second unit data in one of the n sense amplifiers, reads one bit of each second unit data from one of the n sense amplifiers so as to parallelly read a total of z bits, detects the fail bit from the z bits using one of the n detection circuits, and transfers the z bits to the accumulator so as to accumulate the fail bits for each second unit data.

The embodiment will now be described with reference to the accompanying drawings.

FIG. 1 shows the basic arrangement of a nonvolatile semiconductor memory according to the embodiment.

Control circuit 10 controls the write operation for memory cell array MA.

The write operation is performed in a first unit. That is, write and verify (verify read) are performed parallelly for bits of the first unit. The first unit is, for example, a page in a NAND flash memory. One page has, for example, 8 kbytes.

The first unit includes second units. The second unit is smaller than the first unit and is used for error correction. For example, when the number of fail bits in the second unit is smaller than a predetermined value, error correction can be done using ECC (Error-Correcting Code). Hence, the write operation can be ended.

The second unit will be referred to as a segment. One segment has, for example, 512 bytes.

In verity after write, the first units parallelly read from memory cell array MA are temporarily stored in sense amplifiers SA0, SA1, SA2, SA3, . . . , SAn-2, SAn-1 in local column decoders LCD0, LCD1, LCD2, LCD3, . . . , LCDn-2, LCDn-1 for each second unit.

The second unit equals third unit×n (n is a natural number of 2 or more). Each of sense amplifiers SA0, SA1, SA2, SA3, . . . , SAn-2, SAn-1 stores the third units that constitute parts of the second units.

For example, when the second unit is 512 bytes, the third unit is 2 bytes, and n is 256.

Figure 2:
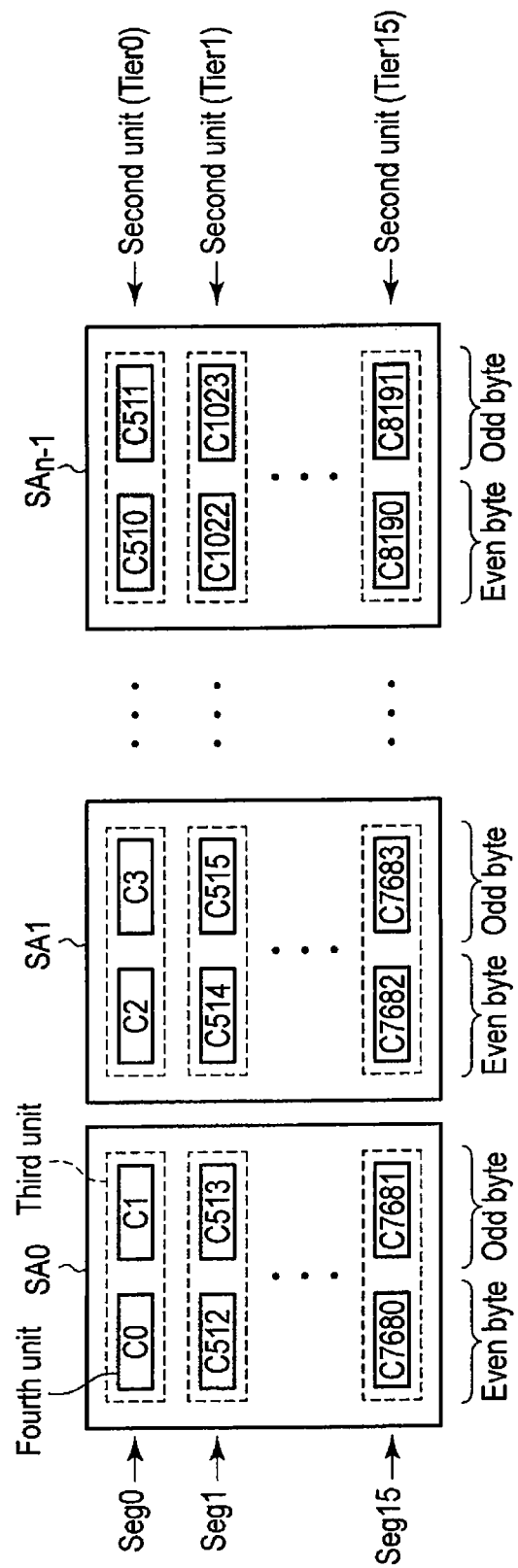
FIG. 2 is a block diagram showing sense amplifiers.

Examples of the second units stored in sense amplifiers SA0, SA1, SA2, SA3, . . . , SAn-2, SAn-1 will be described here with reference to FIG. 2.

In this example, the first unit (one page) is 8 kbytes, the second unit (one segment) is 512 bytes, and the third unit is 2 bytes. At this time, the number of segments in one page is 16. One sense amplifier SAi (I=0 to n−1) has a capacity of 32 bytes (=third unit× the number of segments).

As an example of address assignment, column addresses C0 to C511 are assigned to segment Seg0, column addresses C512 to C1023 are assigned to segment Seg1, . . . , column addresses C7861 to C8191 are assigned to segment Seg15.

However, one column address Cj (j=0 to 8191) includes a fourth unit of 1 byte (8 bits) in this example. An example is a memory (either binary or multilevel) in which eight memory cells to be selected by one column address exist in one page.

Segment Seg0 will be described as an example. Data (1 byte) of column address C0 is stored in sense amplifier SA0 as an even byte. Data (1 byte) of column address C1 is stored in sense amplifier SA0 as an odd byte. Data (1 byte) of column address C2 is stored in sense amplifier SA1 as an even byte. Data (1 byte) of column address C3 is stored in sense amplifier SA1 as an odd byte.

Similarly, data (1 byte) of column address C510 is stored in sense amplifier SAn-1 as an even byte. Data (1 byte) of column address C511 is stored in sense amplifier SAn-1 as an odd byte.

Data (512 bytes) of column addresses C0 to C511 stored in sense amplifiers SA0, SA1, . . . , SAn-1 is defined as tier Tier0, and data (512 bytes) of column addresses C512 to C1023 stored in sense amplifiers SA0, SA1, . . . , SAn-1 is defined as tier Tier1.

Similarly, data (512 bytes) of column addresses C7680 to C8191 stored in sense amplifiers SA0, SA1, . . . , SAn-1 is defined as tier Tier15.

A technique of transferring data from sense amplifiers SA0, SA1, . . . , SAn-1 to serial conversion circuit 11 will be described next.

For example, as shown in FIGS. 3, 4, and 5, data DBUS<15:0> of the third unit (2 bytes, in this example) are parallelly read from one sense amplifier SAi (i=1 to n−1).

Detection circuits DTCT0, DTCT1, . . . , DTCTn-1 correspond to sense amplifiers SA0, SA1, . . . , SAn-1, respectively. Activation signals E0, E1, . . . , En-1 activate detection circuits DTCT0, DTCT1, . . . , DTCTn-1, respectively.

For example, when activation signal E0 is "H", and remaining activation signals E1, . . . , En-1 are "L", detection circuit DTCT0 is activated, and third unit data DBUS<15:0> from sense amplifier SA0 are transferred to serial conversion circuit 11 as third unit data FBUS<15:0>.

Similarly, when activation signal E1 is "H", and remaining activation signals E0, E2, . . . , En-1 are "L", detection circuit DTCT1 is activated, and third unit data DBUS<15:0> from sense amplifier SA1 are transferred to serial conversion circuit 11 as third unit data FBUS<15:0>.

One detection circuit DTCTi (i=0 to n−1) serves as a data inverting circuit formed from, for example, NMOS transistors, as shown in FIG. 4. Ei is the activation signal of detection circuit DTCTi, and φpre is a control signal to precharge FBUS<15:0> to "H (for example, power supply potential Vdd)" before the fail bit detection operation by detection circuit DTCTi.

Assume that concerning a bit for which the write is already complete, the data stored in sense amplifier SAi is "H", and concerning a fail bit for which the write is not complete, the data stored in sense amplifier SAi is "L". In this case, out of data DBUS<15:0>, a bit for which the write is complete is "H", and a fail bit for which the write is not complete is "L".

Hence, out of data FBUS<15:0> output from detection circuit DTCTi, a bit for which the write is complete is "L", and a fail bit for which the write is not complete is "H".

Serial conversion circuit 11 converts parallel data FBUS<15:0> into serial data. Accumulator 12 includes a fail bit counter. The fail bit counter counts the number of fail bits in segments Seg0 to Seg15.

A technique of reading data from sense amplifier SAi will be explained next.

As the technique of reading data DBUS<15:0> from sense amplifier SAi, a first example and a second example to be described below are available.

In the technique of the first example, as shown in FIG. 6, a third unit (for example, column addresses C0 and C1) included in a single second unit (segment) is defined as third unit (2 bytes, in this example) data to be read at once from one sense amplifier SA0.

According to this technique, for example, the number of fail bits of segment Seg0 is detected, and after that, the number of fail bits of segment Seg1 is detected. In this way, segments Seg0 to Seg15 can sequentially undergo fail bit detection one after another.

For example, in the first detection, the data of column addresses C0 and C1 in segment Seg0 (third unit data in sense amplifier SA0) is read, and detection circuit DTCT0 detects fail bits in column addresses C0 and C1, as shown in FIG. 7.

In the second detection, the data of column addresses C2 and C3 in segment Seg0 (third unit data in sense amplifier SA1) is read, and detection circuit DTCT1 detects fail bits in column addresses C2 and C3.

This operation is performed n times (n detections) by selecting n (n=256, in this example) sense amplifiers SA0 to SAn-1 one by one. This allows to perform fail bit detection for the data of column addresses C0 to C511 in segment Seg0.

In a similar manner, detection is performed n times for each of segments Seg1 to Seg15 by selecting n sense amplifiers SA0 to SAn-1 one by one, thereby detecting fail bits.

Hence, fail bit detection for all segments Seg0 to Seg15 in the first unit (for example, page) can be done by repeating the detection operation as many times as the number of segments (16, in this example)×n (256, in this example), that is, 4096 times.

Figure 8:
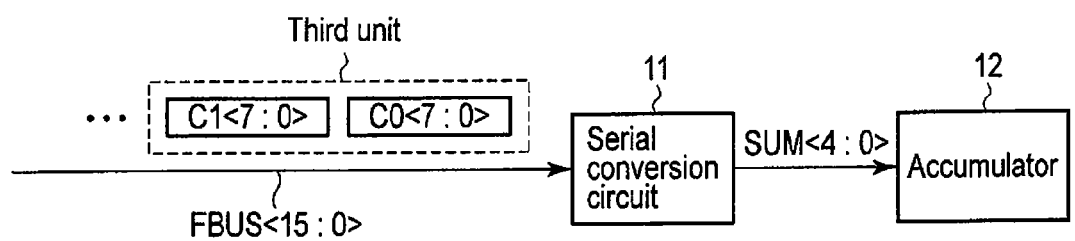
FIG. 8 is a block diagram showing an example of data transfer.

Fail bits detected by each detection operation are input to serial conversion circuit 11, as shown in, for example, FIG. 8. An example will be described here in which data C0<7:0> and C1<7:0> of column addresses C0 and C1 in segment Seg0 are input to serial conversion circuit 11 as FBUS<15:0>.

Figure 9:
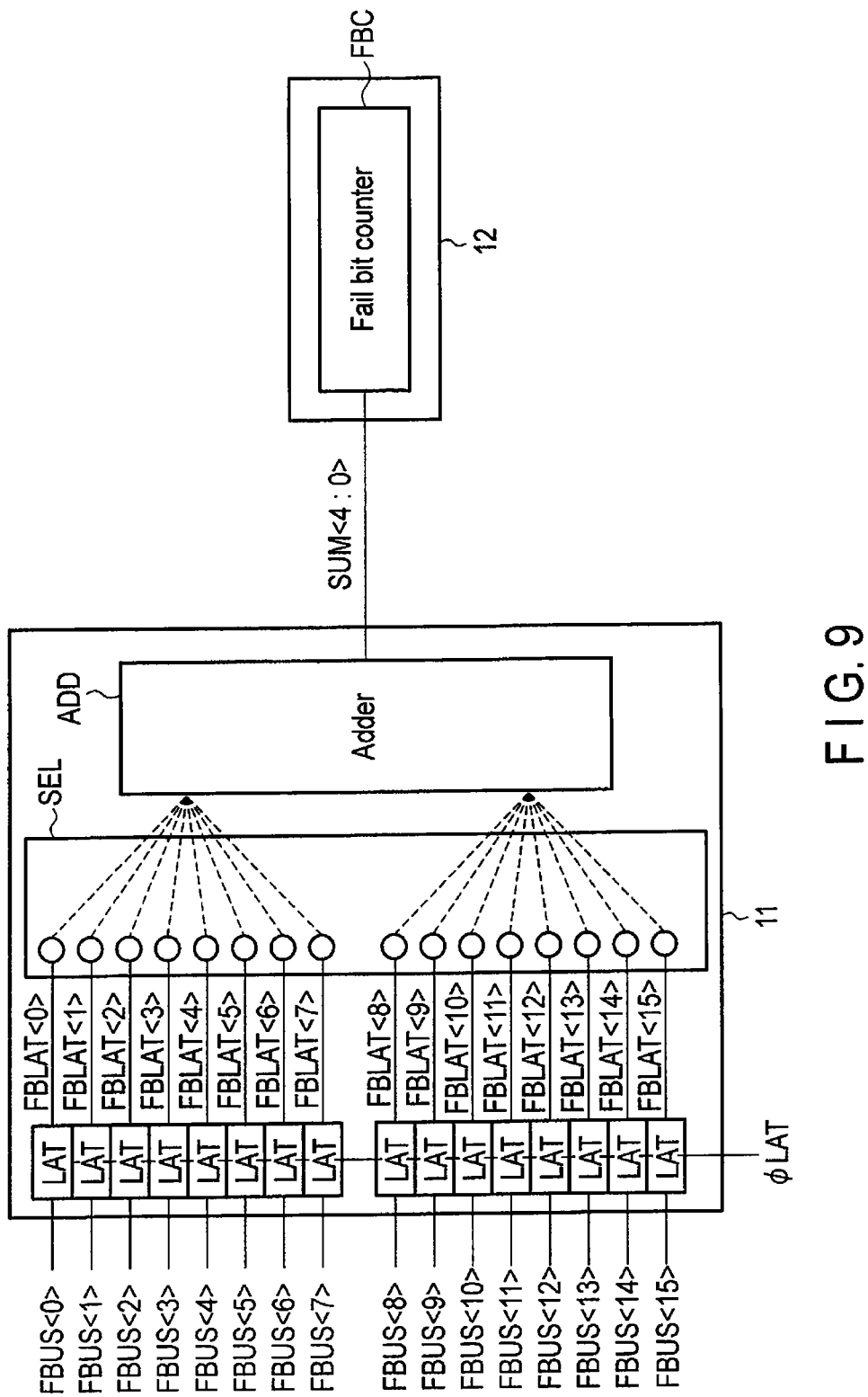
FIG. 9 is a block diagram showing an example of the arrangement of the serial conversion circuit.

FIG. 9 shows an example of the serial conversion circuit.

First, data FBUS<15:0> (=C0<7:0>, C1<7:0>) of column addresses C0 and C1 are input to latch circuits LAT. When latch signal φLAT changes to "H", data FBUS<15:0> (=C0<7:0>, C1<7:0>) of column addresses C0 and C1 are latched by latch circuits LAT. After that, selector SEL sequentially selects data FBLAT<15:0> latched by latch circuits LAT, and adder ADD adds the numbers of fail bits.

The same operation as described above is performed for column addresses C2, C3, . . . , C510, C511 in segment Seg0 (tier Tier0). The sum of the numbers of fail bits existing in segment Seg0 is transferred to fail bit counter FBC in accumulator 12 as SUM<4:0>.

Control circuit 10 determines by considering the value of fail bit counter FBC in accumulator 12 whether to end or repeat the write operation (write and verify).

In this example, 16 segments Seg0 to Seg15 (tiers Tier0 to Tier15) sequentially undergo fail bit detection one after another. However, n sense amplifiers SA0 to SAn-1 may sequentially undergo fail bit detection one after another, as shown in FIG. 10.

This read technique is problematically incompatible with a redundancy replacement technique. For example, assume that DBUS<0> has a failure. The failure means a physical failure such as a failure in the transistor connected to DBUS<0> in detection circuit DTCTi shown in FIG. 4.

At this time, the fail column needs to be replaced with a redundancy column by the redundancy replacement technique. However, for example, as is apparent from the arrangement of sense amplifier SA0 shown in FIG. 6, DBUS<0> is used to detect fail bits in data C0<0>, C512<0>, ..., C7681<0> of 16 column addresses C0, C512, ..., C7681.

Hence, all column addresses C0, C512, ..., C7681 need to be replaced with redundancy column addresses. Realistically, it is difficult to control replacement of column addresses C0, C512, ..., C7681. For this reason, control is performed to replace column addresses C0, C1, C512, C513, ..., C7680, C7681 included in sense amplifier SA0 with redundancy column addresses on the sense amplifier basis.

As described above, in the first example of the read technique, since the redundancy replacement needs to be done on the sense amplifier basis (32 bytes), that is, for each 32 column addresses, the redundancy replacement efficiency is low.

In the second example to be explained below, a technique of reading data DBUS<15:0> from sense amplifier SAi with an improved redundancy replacement efficiency is proposed.

When this read technique is employed, the arrangements of serial conversion circuit 11 and accumulator 12 arranged at the succeeding stage also need to be changed. This will also be described.

In the second example, as shown in FIG. 11, bit data (a total of 2 bytes) included in different second units (16 segments, in this example) are defined as third unit (2 bytes, in this example) data to be read at once from one sense amplifier SA0.

According to this technique, the redundancy replacement efficiency is improved first of all. For example, assume that DBUS<0> has a failure, as in the above-described first example. At this time, two column addresses C0 and C2 in one segment Seg0 that uses DBUS<0> are replaced with redundancy columns by the redundancy replacement technique.

As described above, when, for example, a failure has occurred to impede reading DBUS<0> from one sense amplifier SAi, the redundancy replacement needs to be done for each sense amplifier (32 column addresses) in the first example. In the second example, however, only two column addresses need to be replaced. For this reason, according to the second example, the redundancy replacement efficiency is greatly improved.

Additionally, according to this technique, the number of fail bits can be detected parallelly in all segments Seg0 to Seg15.

Figure 12:
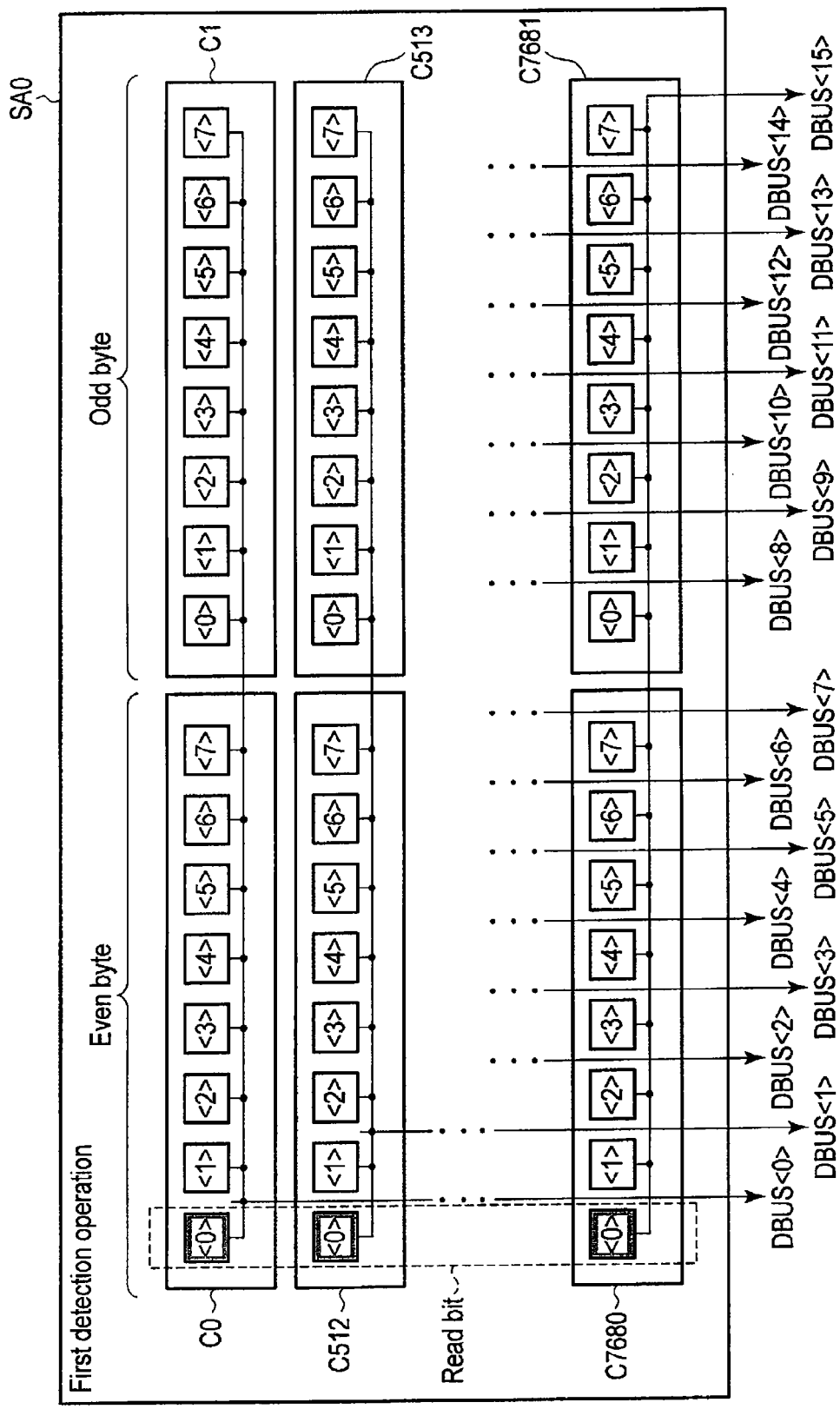

For example, as shown in FIG. 12, in the first detection, data (third unit data in sense amplifier SA0) including one bit C0<0> of column address C0 in segment Seg0, one bit C512<0> of column address C512 in segment Seg1, ..., one bit C7680<0> of column address C7680 in segment Seg15 is read. Detection circuit DTCT0 detects fail bits in data C0<0>, C512<0>, ..., C7680<0>.

Figure 13:
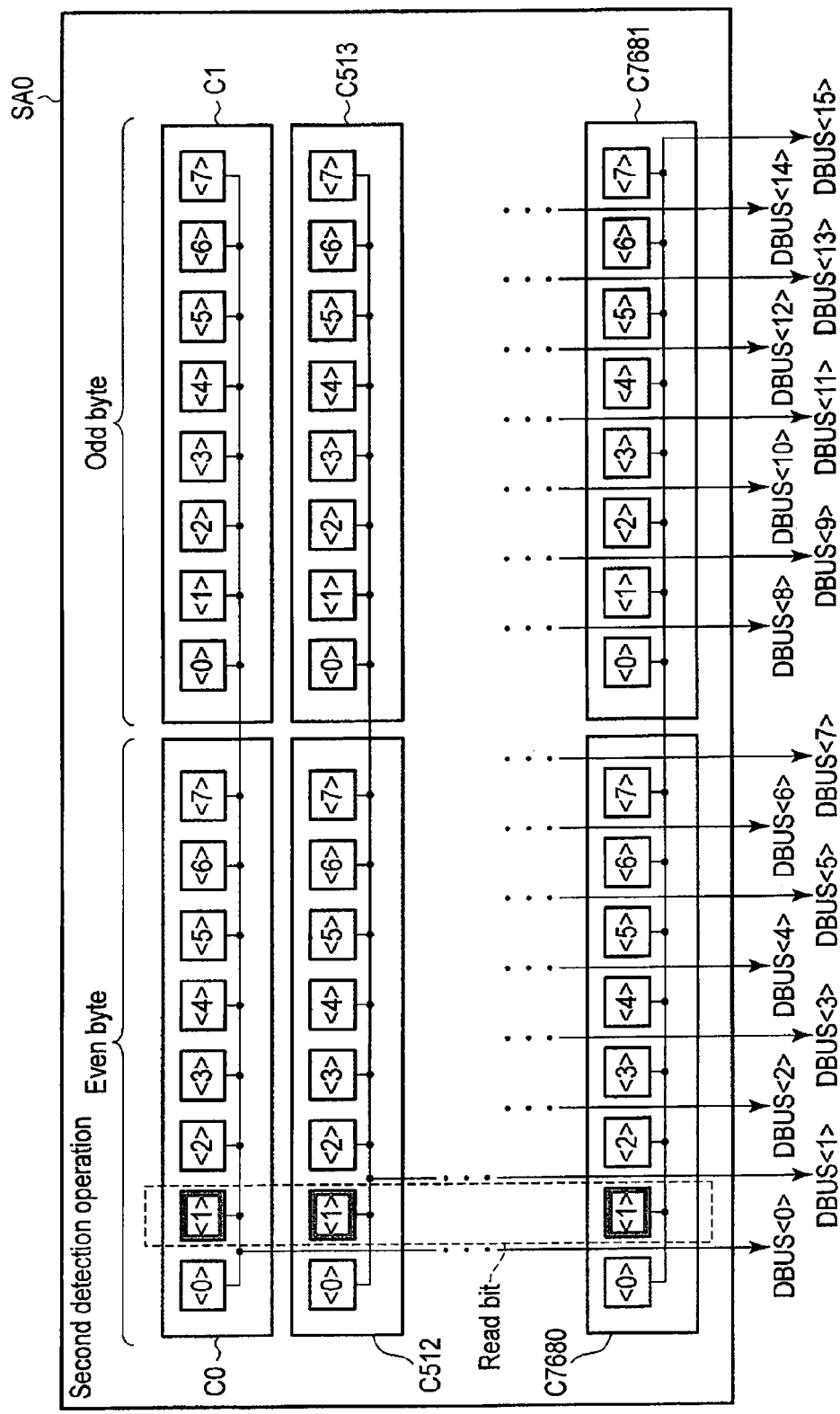

Then, as shown in FIG. 13, in the second detection, data (third unit data in sense amplifier SA0) including one bit C0<1> of column address C0 in segment Seg0, one bit C512<1> of column address C512 in segment Seg1, ..., one bit C7680<1> of column address C7680 in segment Seg15 is read. Detection circuit DTCT0 detects fail bits in data C0<1>, C512<1>, ..., C7680<1>.

This operation is performed for data of all column addresses in one sense amplifier SA0. In this example, to detect fail bits of data of all column addresses in one sense amplifier SA0, the detection operation needs to be repeated 16 times.

That is, as shown in FIG. 14, in the 16th detection, data (third unit data in sense amplifier SA0) including one bit C1<7> of column address C1 in segment Seg0, one bit C513<7> of column address C513 in segment Seg1, ..., one bit C7681<7> of column address C7681 in segment Seg15 is read. Detection circuit DTCT0 detects fail bits in data C1<7>, C513<7>, ..., C7681<7>.

For example, as shown in FIG. 15, this operation is performed n times (n detections) by selecting n (n=256, in this example) sense amplifiers SA0 to SAn-1 one by one. This allows to parallelly detect fail bits in all segments Seg0 to Seg15.

Fail bits detected by each detection operation are input to serial conversion circuit 11, as shown in, for example, FIG. 16. An example will be described here in which data C0<0>, C512<0>, ..., C7680<0> of column addresses C0, C512, ..., C7680 in segments Seg0 to Seg15 are input to serial conversion circuit 11 as FBUS<15:0>.

When the sense amplifier arrangement shown in FIG. 11 and the read technique shown in FIGS. 12, 13, 14, 15, and 16 are employed, the fail bit detection efficiency largely changes depending on the arrangements of the serial conversion circuit and the accumulator. This will be described.

A comparative example will be described first, in which the serial conversion circuit shown in FIG. 9 is used.

FIG. 17 shows the outline of the operation when the serial conversion circuit shown in FIG. 9 is used.

When the read operation of the second example is employed, the operation of the serial conversion circuit also needs to change in the following way.

After the above-described first detection operation, data FBUS<15:0> (=C0<0>, C512<0>, ..., C7680<0>) are input to latch circuits LAT. When latch signal φLAT changes to "H", data FBUS<15:0> (=C0<0>, C512<0>, ..., C7680<0>) are latched by latch circuits LAT.

Selector SEL sequentially selects only FBLAT<0> out of the data latched by latch circuits LAT, and adder ADD adds the numbers of fail bits. After that, latch circuits LAT are reset. That is, only data FBLAT<0> is validated, and remaining data FBLAT<15:1> are invalidated.

After the above-described second detection operation, data FBUS<15:0> (=C0<1>, C512<1>, ..., C7680<1>) are input to latch circuits LAT. When latch signal φLAT changes to "H", data FBUS<15:0> (=C0<1>, C512<1>, ..., C7680<1>) are latched by latch circuits LAT.

Selector SEL sequentially selects only FBLAT<1> out of the data latched by latch circuits LAT, and adder ADD adds the numbers of fail bits. After that, latch circuits LAT are reset. That is, only data FBLAT<1> is validated, and remaining data FBLAT<15:2> and FBLAT<0> are invalidated.

The same operation is repeated 16 times to add the numbers of fail bits for data C0<7:0> and C1<7:0> of column addresses C0 and C1 in one sense amplifier SA0. The above-described operation is performed for n (n=256) sense amplifiers SA0 to SAn-1, thereby detecting the number of fail bits in segment Seg0.

The number of fail bits in segment Seg0 is transferred to fail bit counter FBC in accumulator 12 as SUM<4:0>. After the transfer, adder ADD is reset.

After that, the same operation as described above is repeated 15 times. That is, the number of fail bits is detected for remaining segments Seg1 to Seg15.

This is caused by the arrangement of one sense amplifier shown in FIG. 11 and the fact that only one bit of FBUS<15:0> read from one sense amplifier by each detection operation is validated, and the remaining 15 bits are invalidated.

Figure 18:
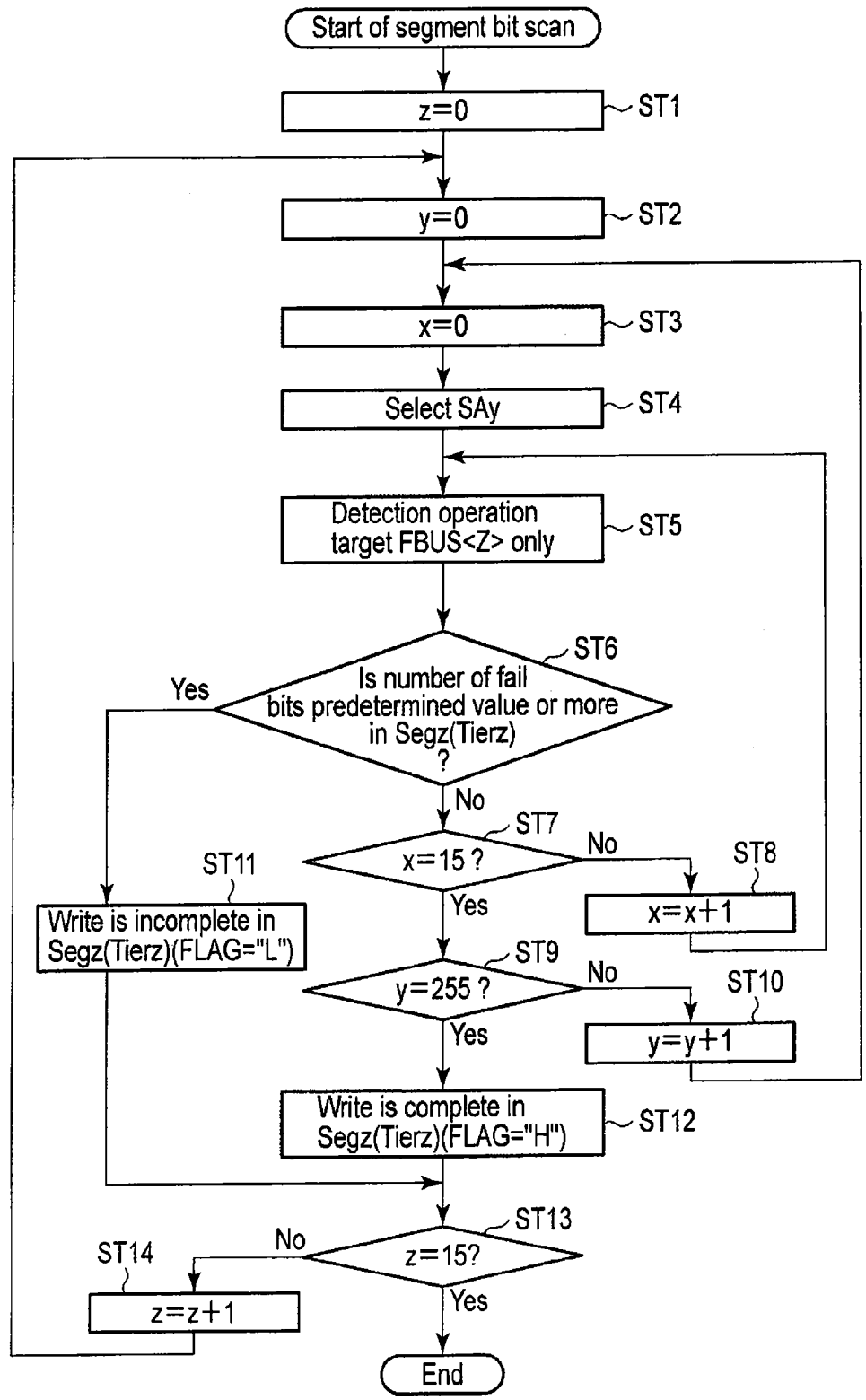
FIG. 18 is a flowchart illustrating a fail bit scan method.

FIG. 18 is the flowchart of the above-described operation.

First, x, y, and z are set to the initial value (=0) (steps ST1 to ST3).

Value x corresponds to the number of fail bit detections in one sense amplifier. When one sense amplifier has 32 bytes, and 2-byte data is read from the one sense amplifier by one detection operation, the detection operation needs to be repeated 16 times to read all data in one sense amplifier. At this time, x changes within the range of 0 to 15.

Value y corresponds to the number of sense amplifiers. When one page has 8 kbytes, one segment has 512 bytes, one page includes 16 segments, and one sense amplifier stores 2-byte data of one segment, 256 sense amplifiers are necessary. At this time, y changes within the range of 0 to 255.

Value z corresponds to the number of segments. In this example, only one bit of FBUS<15:0> read from one sense amplifier by one detection operation is validated, and the remaining 15 bits are invalidated. For this reason, to read 2-byte data of each of the 16 segments from one sense amplifier, the same operation needs to be repeated 16 times. At this time, z changes within the range of 0 to 15.

After x, y, and z are set to the initial value, sense amplifier SA0 is selected, and the fail bit detection operation is performed for sense amplifier SA0 (steps ST4 and ST5).

This detection operation targets only FBUS<0> (DBUS<0>), that is, only segment Seg0 (tier Tier0).

More specifically, only DBUS<0> out of DBUS<15:0> read from sense amplifier SA0 is transferred to adder ADD shown in FIG. 17, and the total number of fail bits in segment Seg0 (tier Tier0) is counted. Until the number of fail bits becomes a predetermined value or more, data read from sense amplifier SA0 is repeated 16 times at maximum (x=0 to 15) (steps ST7 and ST8).

If the number of fail bits does not become the predetermined value or more even after the data read from sense amplifier SA0 has been repeated 16 times at maximum, the same operation as described above is performed for next sense amplifier SA1. Until the number of fail bits equals the predetermined value or more, the selected sense amplifier is sequentially shifted to SA1, SA2, . . . . This operation is repeated 256 times at maximum (y=0 to 255) up to SA255 (steps ST9 and ST10).

If the number of fail bits has become the predetermined value or more halfway through the above-described operation, for example, flag FLAG remains "L" to indicate write incomplete. The process then advances to the fail bit detection operation for next segment Seg1 (tier Tier1) (step ST11).

If the number of fail bits is smaller than the predetermined value even after all data (FBUS<0>) concerning segment Seg0 (tier Tier0) have been read from all sense amplifiers SA0 to SA255, the error bits can be corrected by the error-correcting circuit. Hence, for example, flag FLAG is changed to "H" to indicate write complete. The process then advances to the fail bit detection operation for next segment Seg1 (tier Tier1) (step ST12).

In this example, since the number of segments is 16 (Seg0 to Seg15), the same operation as described above is repeated 16 times (z=0 to 15) (steps ST13 and ST14).

Note that when the number of fail bits in one or more segments is the predetermined value or more in step ST6 of FIG. 18, segment bit scan (the procedure shown in FIG. 18) may be ended to omit fail bit detection in the remaining segments.

As the problem of the above-described comparative example, only one bit of FBUS<15:0> read from one sense amplifier by each detection operation is validated, and the remaining 15 bits are invalidated. For this reason, in the example of the flowchart shown in FIG. 18, steps ST13 and ST14 where z is changed within the range of 0 to 15 are necessary. This lowers the fail bit detection efficiency and makes it difficult to quickly detect the number of fail bits.

In the following example, the arrangements of the serial conversion circuit and the accumulator and the method of counting the total number of fail bits will be explained, which are configured to validate all data FBUS<15:0> read from one sense amplifier by each detection operation and parallelly accumulate the numbers of fail bits in all segments Seg0 to Seg15 (tiers Tier0 to Tier15).

Fail bits detected by each of the detection operations shown in FIGS. 12, 13, 14, and 15 are input to serial conversion circuit 11, as shown in, for example, FIG. 19. An example will be described here in which data C0<0>, C512<0>, . . . , C7680<0> of column addresses C0, C512, . . . , C7680 in segments Seg0 to Seg15 are input to serial conversion circuit 11 as FBUS<15:0>.

Serial conversion circuit 11 transfers the data to accumulator 12 via a Q-bit (Q is a natural number) data bus. In this example, the number of bits of the data bus can be set within the range of 1 bit (minimum) to 16 bits (maximum) (preferably, one of 1, 2, 4, 8, and 16 bits). A data bus having a few bits is advantageous for the interconnection area but disadvantageous for high-speed data transfer. Conversely, a data bus having many bits is advantageous for high-speed data transfer but disadvantageous for the interconnection area.

Figure 20:
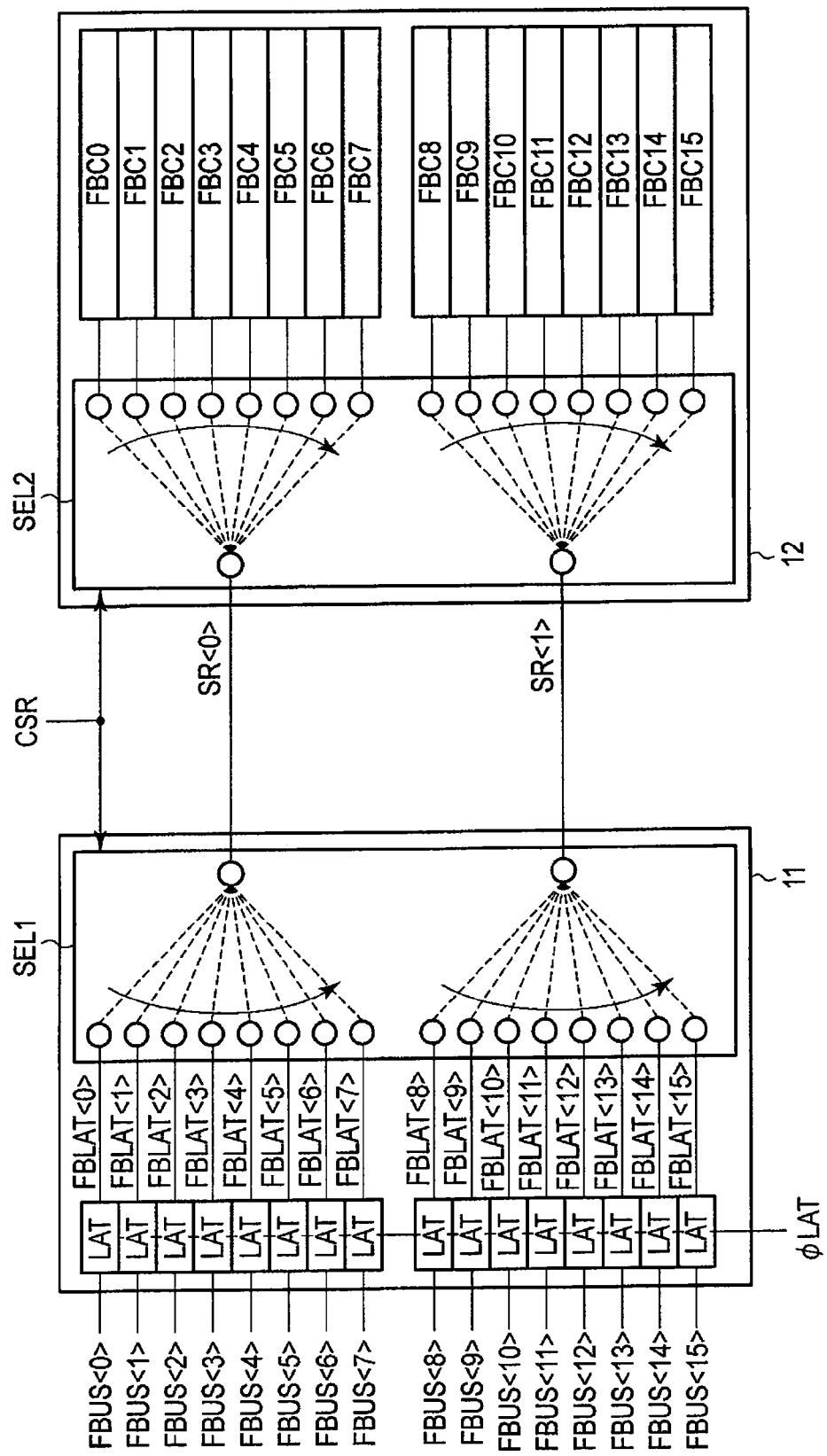
FIG. 20 is a block diagram showing still, another example of the arrangement of the serial conversion circuit.

FIG. 20 shows an example of the serial conversion circuit and the accumulator.

In this example, serial conversion circuit 11 and accumulator 12 are connected to each other via 2-bit data buses SR<0> and SR<1>.

Data FBLAT<7:0> are transferred to fail bit counters FBC7 to FBC0 in accumulator 12 via data bus SR<0>. Data FBLAT<15:8> are transferred to fail bit counters FBC15 to FBC8 in accumulator 12 via data bus SR<1>.

Selector SEL1 in serial conversion circuit 11 selects one bit of FBLAT<7:0> and one bit of FBLAT<15:8> in accordance with select signal CSR. Selector SEL2 in accumulator 12 selects one of fail bit counters FBC7 to FBC0 and one of fail bit counters FBC15 to FBC8 in accordance with select signal CSR.

Figure 21:
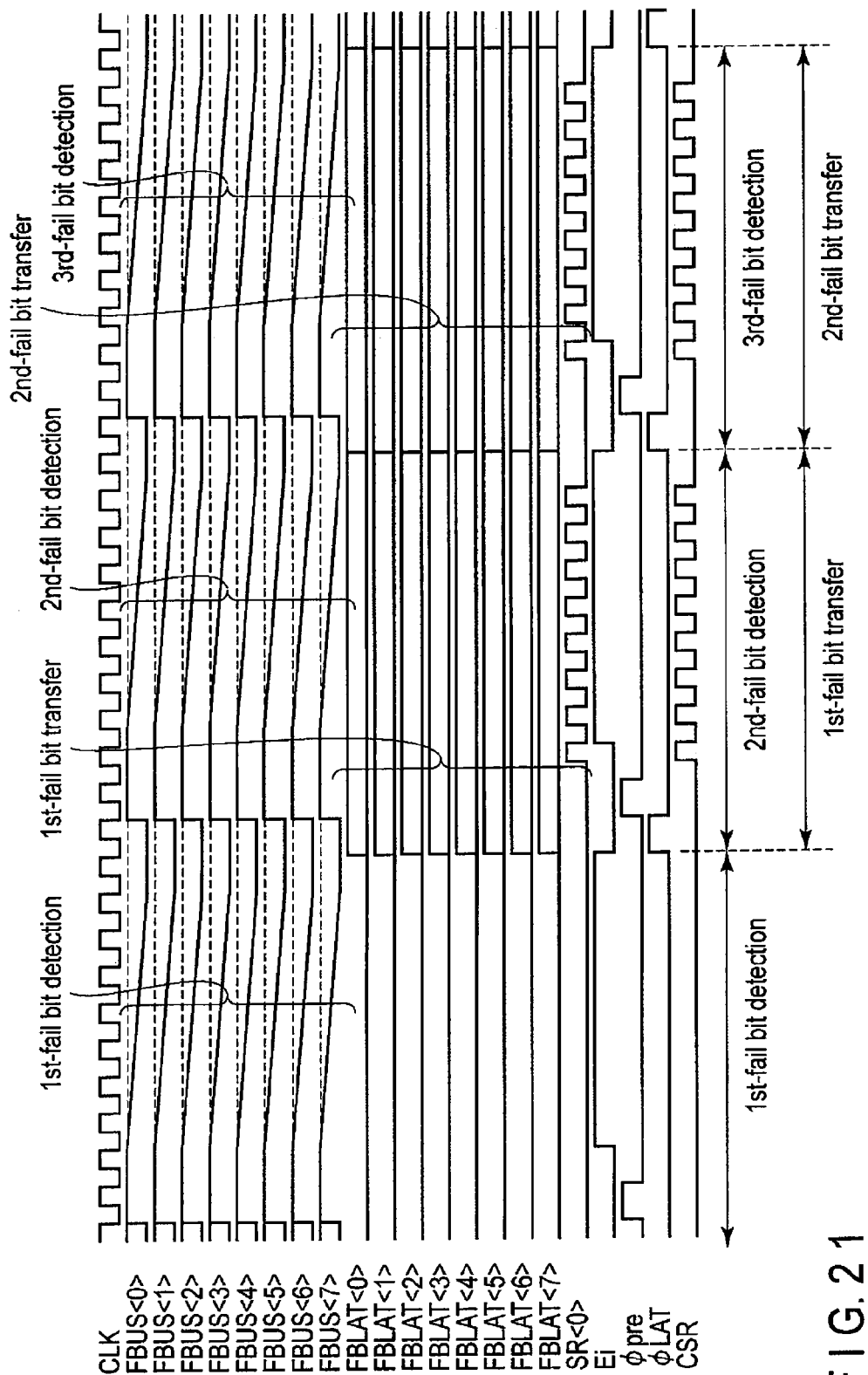
FIG. 21 is a timing chart showing a fail bit scan operation.

FIG. 21 is a timing chart showing the operation of the system shown in FIG. 20.

FIG. 21 shows only FBUS<7:0>. The operation for FBUS<15:8> is the same as that for FBUS<7:0>, and a description thereof will be omitted here.

CLK is a system clock that controls the operation of the entire system. FBUS<7:0>, FBLAT<7:0>, and SR<0> correspond to FBUS<7:0>, FBLAT<7:0>, and SR<0> in FIG. 20.

Activation signal Ei and precharge signal φpre correspond to activation signal Ei of sense amplifier SAi and precharge signal pre of FBUS<15:0> shown in FIG. 4. Signals φLAT and CSR correspond to latch signal φLAT and select signal CSR shown in FIG. 20.

1st-Fail Bit Detection

In the first detection operation (1st-fail bit detection), precharge signal φpre temporarily changes to "H" to precharge FBUS<15:0> to "H". After that, activation signal Ei of detection circuit DTCTi changes to "H" to execute fail bit detection. That is, fail bit detection of DBUS<15:0> (=C0<0>, C512<0>, ..., C7680<0>) read from sense amplifier SAi is performed, and the result is output to FBUS<15:0>.

1st-Fail Bit Transfer and 2nd-Fail Bit Detection

In the first fail bit transfer (1st-fail bit transfer), latch signal φLAT changes to "H", and data FBUS<15:0> (=C0<0>, C512<0>, ..., C7680<0>) are latched by latch circuits LAT.

Selector SEL1 sequentially selects one of FBLAT<7:0> in synchronism with select signal CSR. Selector SEL2 sequentially selects one of FBC7 to FBC0 in synchronism with select signal CSR.

For example, first, FBLAT<0> and FBC0 are selected, and FBLAT<0> (=C0<0>) is transferred to fail bit counter FBC0 via data bus SR<0>. Fail bit counter FBC0 counts the total number of fail bits in segment Seg0 (tier Tier0).

Next, FBLAT<1> and FBC1 are selected, and FBLAT<1> (=C512<0>) is transferred to fail bit counter FBC1 via data bus SR<0>. Fail bit counter FBC1 counts the total number of fail bits in segment Seg1 (tier Tier1). The same operation is performed from FBLAT<2> to FBLAT<7>.

Note that for FBLAT<15:8> as well, the same operation as the transfer operation for FBLAT<7:0> is performed to transfer data to fail bit counters FBC15 to FBC8.

The second detection operation (2nd-fail bit detection) is performed in parallel to the above-described first fail bit transfer.

In the second detection operation, precharge signal φpre temporarily changes to "H" to precharge FBUS<15:0> to "H". After that, activation signal Ei of detection circuit DTCTi changes to "H" to execute fail bit detection. That is, fail bit detection of DBUS<15:0> (=C0<1>, C512<1>, ..., C7680<1>) read from sense amplifier SAi is performed, and the result is output to FBUS<15:0>.

2nd-Fail Bit Transfer and 3rd-Fail Bit Detection

In the second fail bit transfer (2nd-fail bit transfer), latch signal LAT changes to "H", and data FBUS<15:0> (=C0<1>, C512<1>, ..., C7680<1>) are latched by latch circuits LAT.

Selector SEL1 sequentially selects one of FBLAT<7:0> in synchronism with select signal CSR. Selector SEL2 sequentially selects one of FBC7 to FBC0 in synchronism with select signal CSR.

For example, first, FBLAT<0> and FBC0 are selected, and FBLAT<0> (=C0<1>) is transferred to fail bit counter FBC0 via data bus SR<0>. Fail bit counter FBC0 counts the total number of fail bits in segment Seg0 (tier Tier0).

Next, FBLAT<1> and FBC1 are selected, and FBLAT<1> (=C512<1>) is transferred to fail bit counter FBC1 via data bus SR<0>. Fail bit counter FBC1 counts the total number of fail bits in segment Seg1 (tier Tier1).

The same operation is performed from FBLAT<2> to FBLAT<7>.

Note that for FBLAT<15:8> as well, the same operation as the transfer operation for FBLAT<7:0> is performed to transfer data to fail bit counters FBC15 to FBC8.

The third detection operation (3rd-fail bit detection) is performed in parallel to the above-described second fail bit transfer.

In the third detection operation, precharge signal φpre temporarily changes to "H" to precharge FBUS<15:0> to "H". After that, activation signal Ei of detection circuit DTCTi changes to "H" to execute fail bit detection. That is, fail bit detection of DBUS<15:0> (=C0<2>, C7680<2>) read from sense amplifier SAi is performed, and the result is output to FBUS<15:0>.

According to the example shown in FIGS. 20 and 21, serial conversion circuit 11 and accumulator 12 are connected to each other via 2-bit data buses SR<0> and SR<1>, and the detection operation/transfer operation of FBUS<7:0> and the detection operation/transfer operation of FBUS<15:8> are parallelly executed by a so-called pipeline operation.

It is therefore possible to execute fail bit detection at a high speed.

FIG. 22 is the flowchart of the above-described operation.

First, x and y are set to the initial value (=0) (steps ST1 and ST2).

Value x corresponds to the number of fail bit detections in one sense amplifier. When one sense amplifier has 32 bytes, and 2-byte data is read from the one sense amplifier by one detection operation, the detection operation needs to be repeated 16 times to read all data in one sense amplifier. At this time, x changes within the range of 0 to 15.

Value y corresponds to the number of sense amplifiers. When one page has 8 kbytes, one segment has 512 bytes, one page includes 16 segments, and one sense amplifier stores 2-byte data of one segment, 256 sense amplifiers are necessary. At this time, y changes within the range of 0 to 255.

After x and y are set to the initial value, sense amplifier SA0 is selected, and the fail bit detection operation is performed for sense amplifier SA0 (steps ST3 and ST4).

This detection operation targets all data of FBUS<15:0>, that is, all of segments Seg15 to Seg0 (tiers Tier15 to Tier0).

More specifically, all data of DBUS<15:0> read from sense amplifier SA0 are transferred to fail bit counters FBC15 to FBC0 in accumulator 12 via serial conversion circuit 11, as shown in FIG. 20. Fail bit counters FBC15 to FBC0 count the total number of fail bits in segments Seg15 to Seg0 (tiers Tier15 to Tier0).

For a segment in which the number of fail bits is a predetermined value or more, for example, addition of the number of fail bits is ended. For a segment in which the number of fail bits is smaller than the predetermined value, addition of the number of fail bits is continued (steps ST5 and ST6).

For all segments Seg15 to Seg0 (tiers Tier15 to Tier0), until the number of fail bits becomes the predetermined value or more, data read from sense amplifier SA0 is repeated 16 times at maximum (x=0 to 15) (steps ST7 and ST8).

If the number of fail bits does not become the predetermined value or more for all segments Seg15 to Seg0 (tiers Tier15 to Tier0) even after the data read from sense amplifier SA0 has been repeated 16 times at maximum, the same operation as described above is performed for next sense amplifier SA1. Until the number of fail bits equals the predetermined value or more, the selected sense amplifier is sequentially shifted to SA1, SA2, .... This operation is repeated 256 times at maximum (y=0 to 255) up to SA255 (steps ST9 and ST10).

If the number of fail bits has become the predetermined value or more for all segments Seg15 to Seg0 (tiers Tier15 to Tier0) halfway through the above-described operation, for example, all flags FLAG remain "L" to indicate write incomplete, and the write operation continues (step ST11).

Assume that the number of fail bits is smaller than the predetermined value for all segments Seg15 to Seg0 (tiers Tier15 to Tier0) even after all data have been read from all sense amplifiers SA0 to SA255. In this case, for a segment in which the number of fail bits is the predetermined value or more, write incomplete is set (FLAG="L"). For a segment in which the number of fail bits is smaller than the predetermined value, write complete is set (FLAG="H") (step ST12).

Note that flat FLAG represents write complete/incomplete. In the initial state, flags FLAG of all segments are set to, for example, "L (write incomplete)". Only for a segment in which the write is complete, flag FLAG changes to "H".

Note that when the number of fail bits in one or more segments is the predetermined value or more in step ST6 of FIG. 22, segment bit scan (the procedure shown in FIG. 22) may be ended to omit fail bit detection in the remaining segments.

In this example, all data FBUS<15:0> read from one sense amplifier by each detection operation are validated. The numbers of fail bits of all segments Seg15 to Seg0 (tiers Tier15 to Tier0) are accumulated parallelly. Hence, repeating (z=0 to 15) the same operation as many times as the number of segments (Seg0 to Seg15) as shown in FIG. 18 is unnecessary. Hence, fail bit detection can be performed at a high speed.

A modification of fail bit detection employing sense amplifiers having the arrangement shown in FIG. 11 will be described next.

FIGS. 23 and 24 show a byte detection operation.

In the embodiment described above, for each bit of one segment, write complete (pass state) or write incomplete (fail) of the bit is detected. The total number of fail bits is then counted, thereby determining whether to continue or end the write operation for the segment.

In this example, for each byte (8 bits) of one segment, write complete (pass state) or write incomplete (fail) of all bits in the byte is detected. The total number of fail bits is then counted, thereby determining whether to continue or end the write operation for the segment.

First, as shown in FIG. 23, in the first detection, even bytes in sense amplifier SA0 are read.

More specifically, one byte C0<7:0> of column address C0 in segment Seg0, one byte C512<7:0> of column address C512 in segment Seg1, . . . , one byte C7680<7:0> of column address C7680 in segment Seg15 are read. Detection circuit DTCT0 performs fail bit detection for data C0<7:0>, C512<7:0>, . . . , C7680<7:0> on the byte basis.

At this time, sense amplifier SA0 controls read of each bit so as to simultaneously read the even bytes to DBUS<15:0>. Additionally, at this time, the odd bytes are not read to DBUS<15:0>.

The even bytes in one segment are wired OR-connected and commonly connected to one DBUS. Hence, if at least one bit of one byte is write incomplete (fail="L"), the DBUS has the value "L" representing write incomplete.

For example, if at least one bit of even byte C0<7:0> in segment Seg0 is write incomplete (fail="L"), DBUS<0> has the value "L" representing write incomplete. To the contrary, if all bits of even byte C0<7:0> in segment Seg0 are write complete (pass="H"), DBUS<0> has the value "H" representing write complete.

In addition, if at least one bit of even byte C512<7:0> in segment Seg1 is write incomplete (fail="L"), DBUS<1> has the value "L" representing write incomplete. To the contrary, if all bits of even byte C512<7:0> in segment Seg1 are write complete (pass="H"), DBUS<1> has the value "H" representing write complete.

Furthermore, if at least one bit of even byte C7680<7:0> in segment Seg15 is write incomplete (fail="L"), DBUS<15> has the value "L" representing write incomplete. To the contrary, if all bits of even byte C7680<7:0> in segment Seg15 are write complete (pass="H"), DBUS<15> has the value "H" representing write complete.

DBUS<15:0> changes to FBUS<15:0> via, for example, detection circuit DTCTi shown in FIG. 4. For example, when C0<7:0> is assumed to be a fail byte, FBUS<0> is "H". Similarly, when C512<7:0> is assumed to be a fail byte, FBUS<1> is "H". When C7680<7:0> is assumed to be a fail byte, FBUS<15> is "H".

FBUS<15:0> are transferred to fail bit counters FBC15 to FBC0 in accumulator 12 via, for example, serial conversion circuit 11 shown in FIG. 20. That is, the numbers of fail bytes in 16 segments Seg15 to Seg0 are accumulated in fail bit counters FBC15 to FBC0.

Next, as shown in FIG. 24, in the second detection, odd bytes in sense amplifier SA0 are read.

More specifically, one byte C1<7:0> of column address C1 in segment Seg0, one byte C513<7:0> of column address C513 in segment Seg1, . . . , one byte C7681<7:0> of column address C7681 in segment Seg15 are read. Detection circuit DTCT0 performs fail bit detection for data C1<7:0>, C7681<7:0> on the byte basis.

At this time, sense amplifier SA0 controls read of each bit so as to simultaneously read the odd bytes to DBUS<15:0>. Additionally, at this time, the even bytes are not read to DBUS<15:0>.

The odd bytes in one segment are wired OR-connected and commonly connected to one DBUS. Hence, if at least one bit of one byte is write incomplete (fail="L"), the DBUS has the value "L" representing write incomplete.

For example, if at least one bit of odd byte C1<7:0> in segment Seg0 is write incomplete (fail="L"), DBUS<0> has the value "L" representing write incomplete. To the contrary, if all bits of odd byte C1<7:0> in segment Seg0 are write complete (pass="H"), DBUS<0> has the value "H" representing write complete.

In addition, if at least one bit of odd byte C513<7:0> in segment Seg1 is write incomplete (fail="L"), DBUS<1> has the value "L" representing write incomplete. To the contrary, if all bits of odd byte C513<7:0> in segment Seg1 are write complete (pass="H"), DBUS<1> has the value "H" representing write complete.

Furthermore, if at least one bit of odd byte C7681<7:0> in segment Seg15 is write incomplete (fail="L"), DBUS<15> has the value "L" representing write incomplete. To the contrary, if all bits of odd byte C7681<7:0> in segment Seg15 are write complete (pass="H"), DBUS<15> has the value "H" representing write complete.

DBUS<15:0> changes to FBUS<15:0> via, for example, detection circuit DTCTi shown in FIG. 4. For example, when C1<7:0> is assumed to be a fail byte, FBUS<0> is "H". Similarly, when C513<7:0> is assumed to be a fail byte, FBUS<1> is "H". When C7681<7:0> is assumed to be a fail byte, FBUS<15> is "H".

FBUS<15:0> are transferred to fail bit counters FBC15 to FBC0 in accumulator 12 via, for example, serial conversion circuit 11 shown in FIG. 20. That is, the numbers of fail bytes in 16 segments Seg15 to Seg0 are accumulated in fail bit counters FBC15 to FBC0.

This operation is performed n times (n detections) by selecting n (n=256, in this example) sense amplifiers SA0 to SAn-1 one by one. This allows to parallelly perform fail byte detection for all segments Seg15 to Seg0.

According to byte detection of this example, when the number of sense amplifiers is 256, two detection operations are necessary for each sense amplifier. Hence, the detection operation is repeated 512 times in total. In the bit detection operation shown in FIGS. 12, 13, and 14, however, 16 detection operations are necessary for each sense amplifier. Hence, when the number of sense amplifiers is 256, the detection operation needs to be repeated 4096 times in total.

As described above, the byte detection operation can decrease the number of detections and is therefore effective for speeding up the write operation.

In the example shown in FIG. 15, sense amplifiers SA0 to SAn-1 are sequentially selected one by one so that all data in one sense amplifier SA0 are read out, and then, all data in next sense amplifier SA1 are read out. Instead, as shown in FIG.

25, sense amplifiers SA0 to SAn-1 may sequentially be selected one by one so that data is read out once from one sense amplifier SA0, and then, data is read out once from next sense amplifier SA1.

An application example of the nonvolatile semiconductor memory according to the embodiment will be described next.

Figure 26:
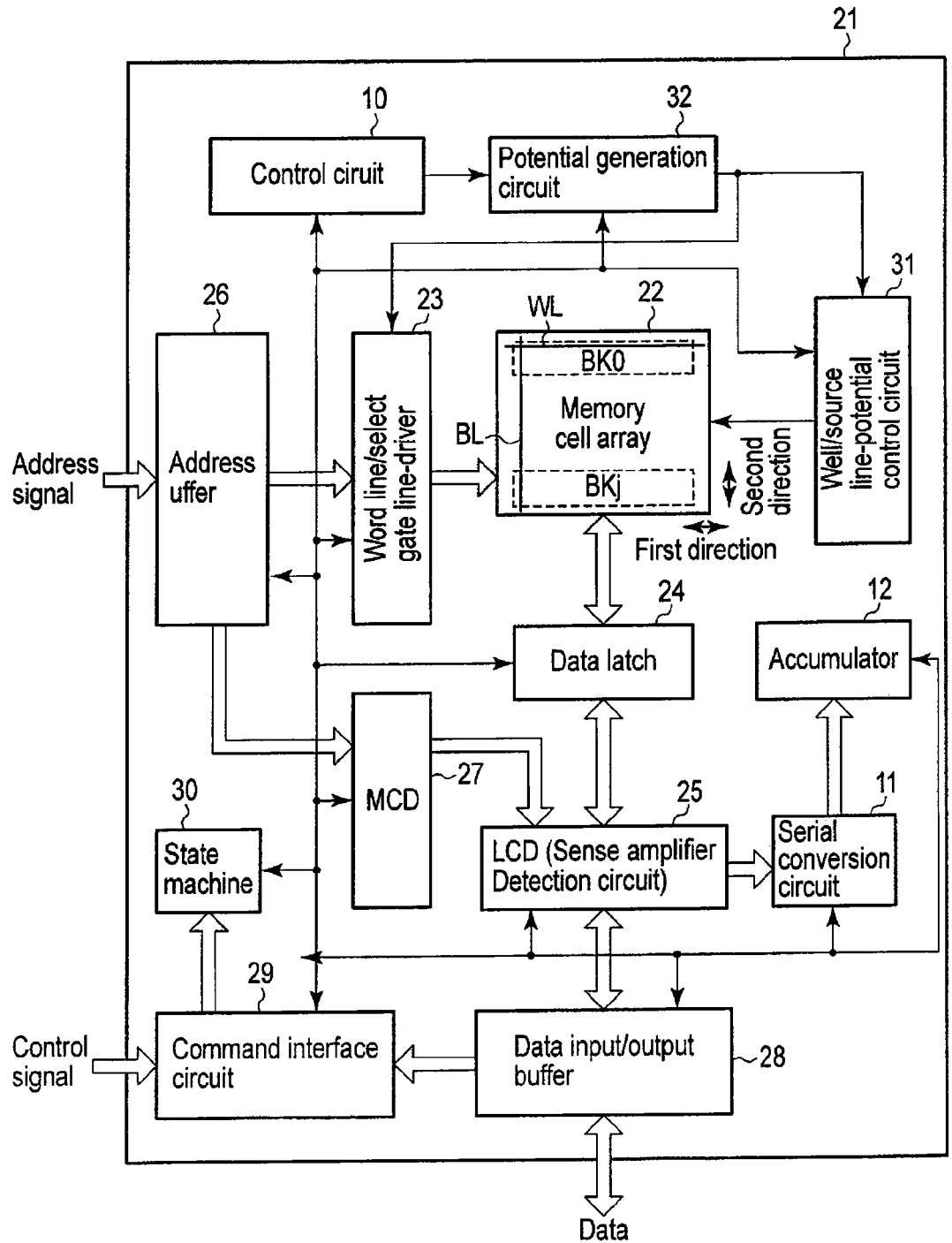
FIG. 26 is a block diagram showing a NAND flash memory as an application example.

FIG. 26 shows the overall arrangement of a NAND flash memory.

NAND flash memory 21 can be either a general-purpose memory or part of an embedded memory. The NAND flash memory can be either of a binary type that stores binary (1-bit) data in one memory cell or of a multilevel type that stores data of three or more values in one memory cell.

Memory cell array 22 comprises, for example, NAND blocks BK0, . . . , BKj. Each NAND block includes a NAND string formed from memory cells connected in series, and two select transistors connected to the two ends of the NAND string, respectively.

Word lines WL run in a first direction, and bit lines BL run in a second direction. Memory cells connected to one word line WL form, for example, one page. One NAND block includes pages. Read/write is performed in, for example, each page, and erase is performed in, for example, each NAND block.

Word line/select gate line-driver 23 controls the potentials of the word lines and select gate lines at the time of read/write/erase. A select gate line means a conductive line connected to the gate electrode of a select transistor.

Data latch 24 temporarily latches data at the time of read/write.

Local column decoder (LCD) 25 corresponds to, for example, local column decoders LCD0 to LCDn-1 in FIG. 1. Local column decoder 25 includes a sense amplifier and a fail bit detection circuit.

In this example, a row address signal out of address signals is input to word line/select gate line-driver 23 via address buffer 26.

Additionally, a column address signal out of address signals is input to local column decoder 25 via address buffer 26 and main column decoder (MCD) 27. That is, a two-stage structure is employed which uses main column decoder 27 and local column decoder 25 to decode the column address signal.

Serial conversion circuit 11 and accumulator 12 correspond to, for example, serial conversion circuit 11 and accumulator 12 in FIG. 20.

Data input/output buffer 28 serves as a data input/output interface to NAND flash memory 21. Command interface circuit 29 determines whether data input to NAND flash memory 21 represents a command. If the data represents a command, command interface circuit 29 instructs state machine 30 of an operation to be performed by NAND flash memory 21 based on a control signal.

Well/source line-potential control circuit 31 controls the potentials of well/source lines at the time of read/write/erase.

Potential generation circuit 32 generates a potential necessary for the operation of NAND flash memory 21. For example, potential generation circuit 32 transfers a predetermined potential to word line/select gate line-driver 23 and well/source line-potential control circuit 31 at the time of read/write/erase.

Control circuit 10 corresponds to control circuit 10 in FIG. 1. Control circuit 10 controls the entire operation of NAND flash memory 21.

Figure 27:
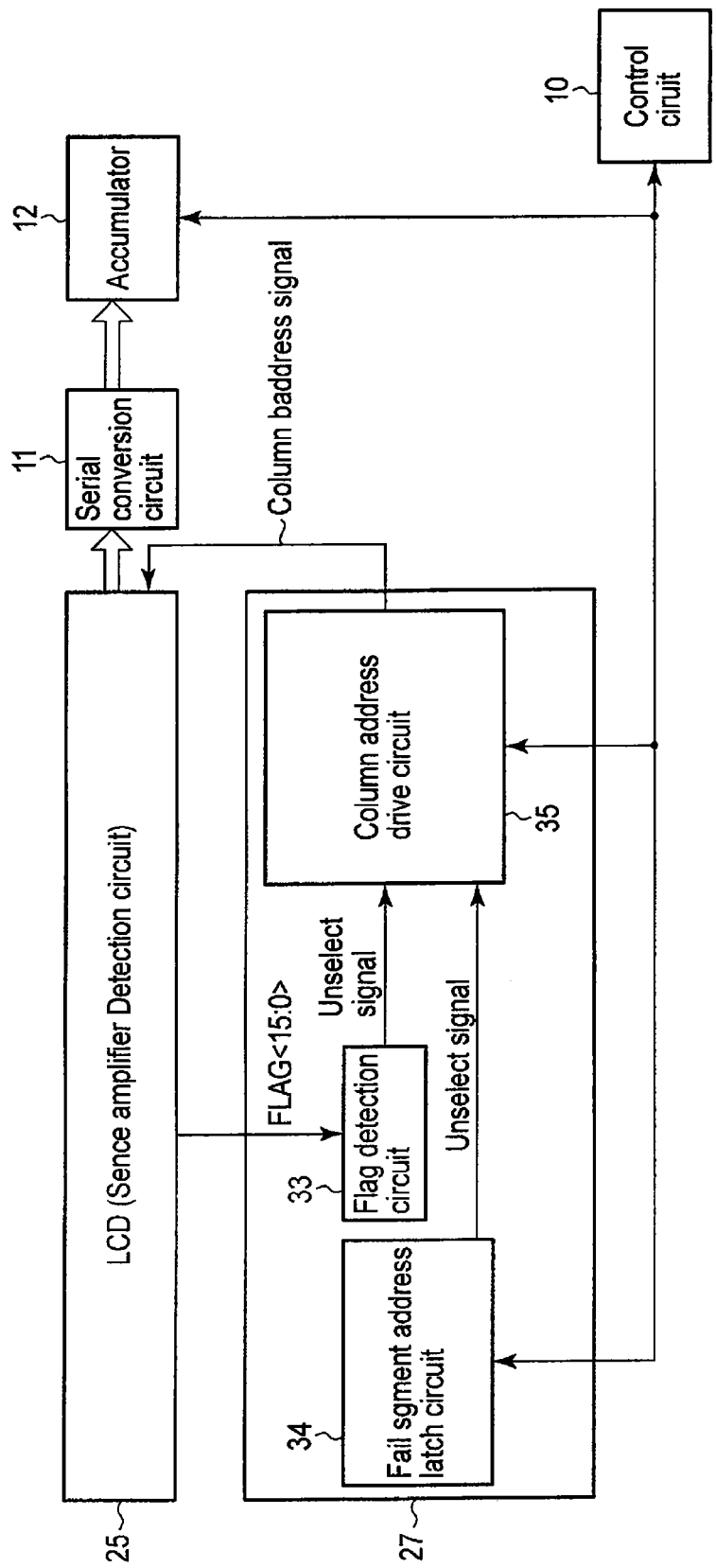
FIG. 27 is a block diagram showing an example of the arrangement of a main column decoder.

FIG. 27 shows an example of the arrangement of main column decoder 27 in FIG. 26.

This example concerns an example of a circuit configured to shorten the fail bit scan time by ending addition of fail bits for a segment in which the number of fail bits becomes a predetermined value or more during fail bit scan in, for example, the flowchart of FIG. 22.

Based on the number of fail bits for each segment, which is accumulated in accumulator 12, control circuit 10 outputs an instruction to fail segment address latch circuit 34 in main column decoder 27 to latch the address of a segment in which the number of fail bits has become the predetermined value or more during fail bit scan.

Based on this instruction, fail segment address latch circuit 34 latches the address of a segment in which the number of fail bits has become the predetermined value or more during fail bit scan. After that, control circuit 10 outputs an unselect signal to column address drive circuit 35 to prohibit fail bit addition for the fail segment.

It is therefore possible to end fail bit addition only for a segment in which the number of fail bits has become the predetermined value or more during fail bit scan.

Flag FLAG of a segment for which the write is complete is, for example, "H". Flag FLAG of a segment for which the write is incomplete is, for example, "L". Flag detection circuit 33 detects the value ("L"/"H") of flag FLAG for each segment, and for a segment for which the write is complete, outputs an unselect signal to column address drive circuit 35 to unselect the segment for which the write is complete not to execute fail bit scan (for example, the flowchart of FIG. 22).

It is therefore possible to prohibit fail bit scan for a segment for which the write is complete and execute fail bit scan only for a segment for which the write is incomplete.

Note that, for example, after the write operation of one page, control circuit 10 outputs a reset signal to accumulator 12 and main column decoder 27 to reset them.

According to the embodiment, the number of fail bits can be detected at a high speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
a memory cell array including memory cells of a first unit in which read and write are parallelly performed;
n (n is a natural number of not less than 2) sense amplifiers;
n detection circuits corresponding to the n sense amplifiers;
an accumulator configured to divide the first unit data read from the memory cell array into z (z is a natural number) second unit data and accumulate a fail bit for which the write is incomplete for the second unit data; and
a control circuit configured to control an operation of detecting the fail bit after the write,
wherein the control circuit
stores third unit data of each second unit data in one of the n sense amplifiers,
reads one bit of each second unit data from one of the n sense amplifiers so as to parallelly read a total of z bits,
detects the fail bit from the z bits using one of the n detection circuits, and transfers the z bits to the accumulator so as to accumulate the fail bits for each second unit data.

2. The memory of claim 1, further comprising a serial conversion circuit configured to convert the z bits into serial data,
wherein the z bits are converted into the serial data and then transferred to the accumulator, and
the control circuit performs a next operation of reading the z bits from one of the n sense amplifiers and detecting the fail bit from the z bits during transfer of the serial data to the accumulator.

3. The memory of claim 1, wherein after the data have been read from all the n sense amplifiers, the control circuit determines that the write is incomplete for second unit data in which the number of fail bits is not less than a predetermined value, and
determines that the write is complete for second unit data in which the number of fail bits is less than the predetermined value.

4. The memory of claim 3, further comprising a flag detection circuit configured to detect a value of a flag representing the write complete/incomplete,
wherein the control circuit ends accumulation of the fail bits for the second unit data for which the write complete is determined.

5. The memory of claim 1, wherein the control circuit does not accumulate from then on the fail bits for second unit data in which the number of fail bits is not less than the predetermined value.

6. The memory of claim 5, further comprising a fail address latch circuit configured to latch an address of the second unit data in which the number of fail bits is not less than the predetermined value.

7. The memory of claim 1, wherein the third unit is formed from 2 bytes including an even byte and an odd byte, and
the control circuit repetitively performs the read from one of the n sense amplifiers 16 times.

8. The memory of claim 1, wherein the third unit data stored in one of the n sense amplifiers is assigned to one column address on a byte basis.

9. The memory of claim 8, wherein the third unit data stored in one of the n sense amplifiers includes an even byte and an odd byte.

10. The memory of claim 1, wherein the second unit is a unit of error correction.

11. A nonvolatile semiconductor memory comprising:
a memory cell array including memory cells of a first unit in which read and write are parallelly performed;
n (n is a natural number of not less than 2) sense amplifiers;
n detection circuits corresponding to the n sense amplifiers;
an accumulator configured to divide the first unit data read from the memory cell array into z (z is a natural number) second unit data and accumulate a fail byte for which the write is incomplete for the second unit data; and
a control circuit configured to control an operation of detecting the fail byte after the write,
wherein the control circuit stores third unit data of each second unit data in one of the n sense amplifiers,
reads one bit from one of the n sense amplifiers by wired OR-connecting one byte of each second unit data so as to parallelly read a total of z bits,
detects the fail byte from the z bits using one of the n detection circuits, and
transfers the z bits to the accumulator so as to accumulate the fail bytes for each second unit data.

12. The memory of claim 11, further comprising a serial conversion circuit configured to convert the z bits into serial data,
wherein the z bits are converted into the serial data and then transferred to the accumulator, and
the control circuit performs a next operation of reading the z bits from one of the n sense amplifiers and detecting the fail byte from the z bits during transfer of the serial data to the accumulator.

13. The memory of claim 11, wherein after the data have been read from all the n sense amplifiers, the control circuit determines that the write is incomplete for second unit data in which the number of fail bytes is not less than a predetermined value, and
determines that the write is complete for second unit data in which the number of fail bytes is less than the predetermined value.

14. The memory of claim 13, further comprising a flag detection circuit configured to detect a value of a flag representing the write complete/incomplete,
wherein the control circuit ends accumulation of the fail bytes for the second unit data for which the write complete is determined.

15. The memory of claim 11, wherein the control circuit does not accumulate from then on the fail bytes for second unit data in which the number of fail bytes is not less than the predetermined value.

16. The memory of claim 15, further comprising a fail address latch circuit configured to latch an address of the second unit data in which the number of fail bytes is not less than the predetermined value.

17. The memory of claim 11, wherein the third unit is formed from 2 bytes including an even byte and an odd byte, and
the control circuit performs two reads including read of the even byte and read of the odd byte from one of the n sense amplifiers.

18. The memory of claim 11, wherein the third unit data stored in one of the n sense amplifiers is assigned to one column address on a byte basis.

19. The memory of claim 11, wherein the third unit data stored in one of the n sense amplifiers includes the wired OR-connected even byte and the wired OR-connected odd byte.

20. The memory of claim 11, wherein the second unit is a unit of error correction.

* * * * *